(12) United States Patent
Tanaka et al.

(10) Patent No.: US 8,361,692 B2
(45) Date of Patent: Jan. 29, 2013

(54) NEGATIVE RESIST COMPOSITION AND PATTERNING PROCESS USING THE SAME

(75) Inventors: Akinobu Tanaka, Jyoetsu (JP); Keiichi Masunaga, Jyoetsu (JP); Daisuke Domon, Jyoetsu (JP); Satoshi Watanabe, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 340 days.

(21) Appl. No.: 12/662,763

(22) Filed: May 3, 2010

(65) Prior Publication Data
US 2010/0304301 A1    Dec. 2, 2010

(30) Foreign Application Priority Data
May 29, 2009    (JP) .................... 2009-130257

(51) Int. Cl.
G03F 7/004    (2006.01)
G03F 7/038    (2006.01)
G03F 7/26    (2006.01)
(52) U.S. Cl. .............. 430/270.1; 430/296; 430/322
(58) Field of Classification Search ........... 430/270.1, 430/296, 322, 325, 927
See application file for complete search history.

(56) References Cited

U.S. PATENT DOCUMENTS

| | | | |
|---|---|---|---|
| 2006/0128914 A1* | 6/2006 | Allen et al. ................ 526/245 |
| 2006/0166133 A1 | 7/2006 | Koitabashi et al. |
| 2006/0204891 A1 | 9/2006 | Hatakeyama |
| 2008/0020290 A1 | 1/2008 | Hatakeyama et al. |
| 2008/0038662 A1* | 2/2008 | Hatakeyama et al. ..... 430/270.1 |
| 2008/0241751 A1 | 10/2008 | Takeda et al. |
| 2009/0087799 A1 | 4/2009 | Tachibana et al. |
| 2010/0009299 A1* | 1/2010 | Watanabe et al. ............ 430/326 |
| 2010/0151381 A1* | 6/2010 | Tachibana et al. ......... 430/270.1 |

FOREIGN PATENT DOCUMENTS

| | | |
|---|---|---|
| JP | A-2002-244297 | 8/2002 |
| JP | A-2003-246825 | 9/2003 |
| JP | A-2004-149756 | 5/2004 |
| JP | A-2005-250434 | 9/2005 |
| JP | A-2006-169302 | 6/2006 |
| JP | A-2006-201532 | 8/2006 |
| JP | A-2006-215180 | 8/2006 |
| JP | A-2008-249762 | 10/2008 |
| JP | A-2008-249951 | 10/2008 |

OTHER PUBLICATIONS

European Search Report issued in Application No. 10 00 4935; Dated Sep. 20, 2010.
Japanese Office Action issued in Application No. 2009-130257; Dated Sep. 20, 2011 (With Partial Translation).
May 30, 2012 Office Action issued in Chinese Patent Application No. 201010194426.7 (with partial translation).
Sep. 19, 2012 Office Action issued in European Patent Application No. 10 004 935.2.

* cited by examiner

*Primary Examiner* — Anca Eoff
(74) *Attorney, Agent, or Firm* — Oliff & Berridge, PLC

(57) ABSTRACT

There is disclosed a negative resist composition comprising (A) a base polymer which is soluble in alkali and which is insolubilized in alkali by an action of an acid; and/or a combination of a crosslinking agent and a base polymer which is soluble in alkali and which is reacted with the crosslinking agent by an action of an acid to thereby be insolubilized in alkali, (B) an acid generator, and (C) a nitrogen-containing compound as a basic component; wherein the polymer to be used as the base polymer is: a polymer, which is obtained by polymerizing two or more kinds of monomers represented by the following general formula (1), or which is obtained by polymerizing a monomer mixture containing one or more kinds of monomers represented by the general formula (1) and one or more kinds of styrene monomers represented by the following general formula (2).

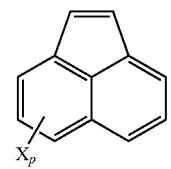

(1)

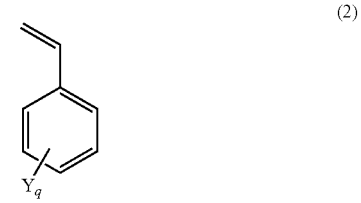

(2)

18 Claims, No Drawings

NEGATIVE RESIST COMPOSITION AND PATTERNING PROCESS USING THE SAME

BACKGROUND OF THE INVENTION

1. Field of the Invention

The present invention relates to negative resist composition and patterning process using the same.

2. Description of the Related Art

It is known that finer pattern rules are demanded with highly integrated LSI's providing highly increased speeds. This has correspondingly led to largely changed exposure methods and resist compositions, and particularly, KrF or ArF excimer laser light, electron beam, or the like are used as exposure light sources upon conduction of lithography of patterns at 0.2 μm or less, in a manner to adopt chemically amplified resists as a photoresist, which exhibit excellent sensitivities to such high energy radiations and provide higher resolutions.

Resist compositions are classified into a positive type where exposed areas are made to be dissolvable and a negative type where exposed areas are left as a pattern, and that one of them is selected and used, which can be more conveniently handled depending on a required resist pattern. Further, chemically amplified negative resist compositions are each typically configured to contain: a polymer dissolvable in an aqueous alkaline developer; an acid generator to be decomposed by exposure light to produce an acid; and a crosslinking agent for forming cross-linkages among polymer molecules with the aid of the acid as a catalyst, thereby making the polymer to become insoluble in the developer (the polymer compound and the crosslinking agent are integrated with each other, in some cases); as well as a basic compound for restricting diffusion of the acid produced by the typical exposure.

Negative resist compositions of a type configured to adopt phenol units as alkali-soluble units constituting a polymer compound to be dissolved in the aqueous alkaline developer, have been numerously developed, and particularly for exposure by a KrF excimer laser light. Since phenol units of these compositions do not exhibit light transmittivity in the case of exposure light having wavelengths in a range of 150 to 220 nm, the compositions have not been used for ArF excimer laser light. However, such negative resist compositions have been recently noticed again as ones for EB and EUV exposure which are exposure methods for obtaining finer patterns, and reports thereof are found in Japanese Patent Application Laid-open (kokai) Nos. 2006-201532, 2006-215180, 2008-249762, and the like.

Further, examples of characteristics to be demanded for resist compositions in the case of the resist elaboration as noted above, include not only a higher resolution which is a fundamental performance of a resist, but also a higher etching resistance. This is because, progressively finer patterns necessitate to progressively decrease thicknesses of resist films. Known as one technique for obtaining such a higher etching resistance, is a method, which also has been disclosed in Japanese Patent Application Laid-open (kokai) No. 2008-249762, to introduce, as subsidiary components of the polymer: a polycyclic compound such as indene, acenaphthylene or the like, which includes an aromatic ring(s) and a non-aromatic ring(s), and in which the non-aromatic ring has a carbon-carbon double bond conjugated with the aromatic ring; into a polymer having hydroxystyrene units.

In turn, as polymers for positive resists, it has been proposed to use a polymer having only indene structures such as described in Japanese Patent Application Laid-open (kokai) No. 2004-149756, while another method has been proposed in Japanese Patent Application Laid-open (kokai) No. 2006-169302 to use units having acenaphthylene structures by combining them with a hydroxystyrene derivative.

However, in trying to conduct such a fine processing that gaps between line widths are decreased down to as narrow as 50 nm which is demanded in the presently most-advanced processing technique, bridges are caused between pattern lines even by variously conducting a fine control by adopting a polymer system which has been conventionally presented for a negative resist composition, thereby making it difficult to form a fine pattern.

SUMMARY OF THE INVENTION

Conventionally, such a problem of bridges between pattern lines has been solved to a certain extent, by adopting a method to increase an amount of a basic component to be added into a resist composition, thereby enhancing a contrast against an acid. However, such a solving method inevitably deteriorates a sensitivity of the resist, due to the increased amount of the basic component. Further, it is typical in conventional methods to deal with a sensitivity deterioration by increasing an addition amount of an acid generator. However, adoption of a large amount of an acid generator results in a problem of attenuation of exposure light within a film in the case that an energy source for pattern exposure is light, and results in a problem of occasional incapability of further increasing the amount of the acid generator in the case that the energy source is an electron beam because a considerably large amount of the acid generator has been already added then.

The present invention has been carried out in view of the above circumstances, and it is therefore an object of the present invention to provide: a negative resist composition having an excellent resolution and an enhanced etching resistance in photolithography for fine processing, and particularly in photolithography adopting, as an exposure source, KrF laser, extreme ultraviolet rays, electron beam, X-rays, or the like; and a pattern forming process utilizing the negative resist composition.

To solve the above problem, the present invention provides a negative resist composition comprising at least:

(A) a base polymer which is soluble in alkali and which is insolubilized in alkali by an action of an acid; and/or a combination of a crosslinking agent and a base polymer which is soluble in alkali and which is reacted with the crosslinking agent by an action of an acid to thereby be insolubilized in alkali;

(B) an acid generator; and (C) a nitrogen-containing compound as a basic component;

wherein the polymer to be used as the base polymer is: a polymer, which is obtained by polymerizing two or more kinds of monomers represented by the following general formula (1), or which is obtained by polymerizing a monomer mixture containing one or more kinds of monomers represented by the general formula (1) and one or more kinds of styrene monomers represented by the following general formula (2); or a polymer obtained by subjecting the functional groups of the polymerizedly obtained polymer to a further chemical conversion; and wherein the repeating units derived from the monomers represented by the general formula (1) are included in the obtained polymer at a sum ratio of 50 mole % or more relative to a total amount of all repeating units constituting the obtained polymer:

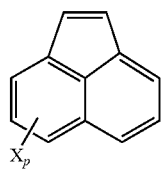

(1)

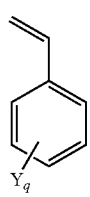

(2)

(in the formulae,

X represents (when present in plural, each independently represent): a hydroxyl group; a tri-hydrocarbon substituted silyloxy group having 3 to 18 carbon atoms; a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; a sulfinyl group; a sulfonyl group; or an alkyl group having 1 to 6 carbon atoms;

p is an integer of 0 to 4;

Y represents (when present in plural, each independently represent): a hydroxyl group; a trialkylsilyl group having 3 to 18 carbon atoms; a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; a sulfinyl group; a sulfonyl group; or an alkyl group having 1 to 6 carbon atoms;

q is an integer of 0 to 3; and at least one of X and Y is a hydroxyl group, or a substitutional group which is to be converted into a hydroxyl group by a chemical conversion).

In this way, when the polymer to be used as the base polymer is a polymer, which is obtained by polymerizing two or more kinds of monomers represented by the above general formula (1), or which is obtained by polymerizing a monomer mixture containing one or more kinds of monomers represented by the general formula (1) and one or more kinds of styrene monomers represented by the above general formula (2); or a polymer obtained by subjecting the functional groups of the polymerizedly obtained polymer to a further chemical conversion; and the repeating units derived from the monomers represented by the general formula (1) are included in the obtained polymer at a sum ratio of 50 mole % or more relative to a total amount of all repeating units constituting the obtained polymer; it is possible to form, by the negative resist composition prepared by adopting the base polymer, a resist film having an excellent resolution and an enhanced etching resistance in photolithography, and particularly in lithography adopting, as an exposure source, KrF laser, extreme ultraviolet rays, electron beam, X-rays, or the like.

Further, it is preferable that the further chemical conversion, to which the functional groups of the polymerizedly obtained polymer is subjected, is hydrolysis. Although it is not indispensable to conduct polymerization after protecting the monomers having phenolic hydroxyl groups with hydrolyzable groups, respectively, this procedure is used typically.

In such a case to adopt the protected monomers, the base polymer of the negative resist composition can be easily made soluble in alkali by conducting hydrolysis in this way.

It is also preferable that the polymer to be used as the base polymer contains repeating units represented by the following general formulae (3) and (4), respectively;

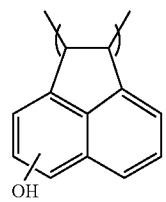

(3)

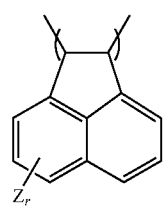

(4)

(in the formulae,

Z represents (when present in plural, each independently represent): a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; a sulfinyl group; a sulfonyl group; or an alkyl group having 1 to 6 carbon atoms; and r is an integer of 0 to 4); and wherein the repeating units represented by the general formulae (3) and (4) are included in the obtained polymer at a sum ratio of 50 mole % or more relative to a total amount of all repeating units constituting the obtained polymer.

In this way, when the repeating units represented by the general formulae (3) and (4) are included in the obtained polymer at a sum ratio of 50 mole % or more relative to a total amount of all repeating units constituting the obtained polymer, it is possible to form, by the negative resist composition prepared by adopting the base polymer, a resist film having an excellent resolution and an enhanced etching resistance in photolithography, and particularly in lithography adopting, as an exposure source, KrF laser, extreme ultraviolet light, electron beam, X-rays, or the like.

It is preferable for the base polymer of the negative resist composition that the repeating units derived from the monomers represented by the general formula (1) are included in the obtained polymer at a ratio of 70 mole % or more relative to a total amount of all repeating units constituting the obtained polymer.

In this way, the negative resist composition comprising the base polymer, in which the repeating units derived from the monomers represented by the general formula (1) are included in the obtained polymer at a ratio of 70 mole % or more relative to a total amount of all repeating units constituting the obtained polymer, is capable of further enhancing an etching resistance of a resist film.

It is preferable that the negative resist composition includes, as the basic component as the component (C), at least one or more kinds of amine compounds and amine oxide compounds, each having a carboxyl group and each having no hydrogen atoms covalently bonded to a nitrogen atom as a basicity center.

In this way, by including as the basic component as the component (C), at least one or more kinds of amine compounds and amine oxide compounds, each having a carboxyl group and each having no hydrogen atoms covalently bonded to a nitrogen atom as a basicity center, it is enabled to more effectively prevent occurrence of undercuts.

In this case, it is preferable that the composition includes, as the amine compounds and amine oxide compounds, each having a carboxyl group and each having no hydrogen atoms covalently bonded to a nitrogen atom as a basicity center, at least one or more kinds of compounds represented by the following general formulae (5) to (7), respectively:

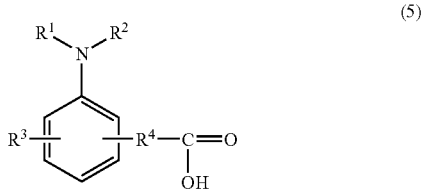

(5)

(in the formula, $R^1$ and $R^2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthio-alkyl group having 1 to 10 carbon atoms;

$R^1$ and $R^2$ may be bonded to each other to form a ring structure;

$R^3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, an alkylthio-alkyl group having 1 to 10 carbon atoms, a halogen group, or a hydroxyl group; and may form a ring together with a carbon to which $R^3$ is bonded and together with another carbon adjacent to the carbon; and $R^4$ is a single bond, a linear, branched, or cyclic alkylene group having 1 to 20 carbon atoms, or an arylene group having 6 to 20 carbon atoms, which group may include one or several hydroxyl groups, carboxyl groups, carbonyl groups, and the like);

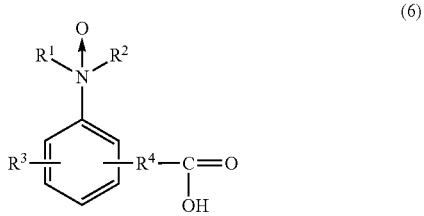

(6)

(in the formula, $R^1$, $R^2$, $R^3$, and $R^4$ are the same as the above); and

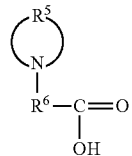

(7)

(in the formula, $R^5$ is a linear or branched substitutable alkylene group having 2 to 20 carbon atoms, wherein the alkylene group may include, between its carbon atoms, one or several carbonyl groups, ether groups, ester groups, and sulfides; and $R^6$ is a linear, branched, or cyclic alkylene group having 1 to 20 carbon atoms, or an arylene group having 6 to 20 carbon atoms).

In this way, by including, as the amine compounds and amine oxide compounds, each having a carboxyl group and each having no hydrogen atoms covalently bonded to a nitrogen atom as a basicity center, at least one or more kinds of compounds represented by the above general formulae (5) to (7), respectively, it is enabled to achieve a pattern profile exhibiting a higher resolution and providing pattern lines excellent in perpendicularity in profile at a substrate-side boundary face of resist.

It is possible that the basic component as the component (C) further contains at least one or more kinds of amine compounds and amine oxide compounds represented by the following general formulae (8) and (9), respectively:

(8)

(in the formula, $R^7$, $R^8$, and $R^9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthio-alkyl group having 1 to 10 carbon atoms; and any two of $R^7$, $R^8$, and $R^9$ may be bonded to each other to form a ring structure or an aromatic ring); and

(9)

(in the formula, $R^7$, $R^8$, and $R^9$ are the same as the above).

In this way, the amine compounds and amine oxide compounds, each having a carboxyl group and each having no hydrogen atoms covalently bonded to a nitrogen atom as a basicity center, can be additionally combined with one or more kinds of amine compounds and amine oxide compounds represented by the above general formulae (8) and (9), respectively.

Further, the present invention provides a resist pattern forming process for forming a resist pattern by lithography, comprising at least the steps of:

forming a resist film on a processed substrate, by using the negative resist composition of the present invention;

exposing the resist film to a high energy beam; and developing the resist film by an alkaline developer, to obtain a resist pattern.

By adopting such a resist pattern forming process of the present invention, it is enabled to obtain a resist pattern capable of restricting occurrence of undercuts, excellent in resolution, and preferable in profile, even in formation of a pattern having a minimum line width of 50 nm or less.

In turn, it is possible to use a photomask blank as the processed substrate.

In the case of fabrication of a photomask, it is required not only to form a pattern having fine line widths so as to form a mask pattern shape utilizing OPC (Optical Proximity Effect Correction) or the like, but also to avoid occurrence of defects such as due to separations to a stricter level than pattern formation upon fabrication of a semiconductor device because the mask pattern is used as a master upon conducting lithography. As such, the resist pattern forming process of the present invention capable of restricting occurrence of separations and the like due to undercuts, is preferably utilizable.

The resist pattern forming process of the present invention is usefully utilizable, also in a case that the photomask blank has an outermost surface layer formed with a chromium compound film thereon.

Resist pattern formation on a chromium compound film is more susceptible to occurrence of undercuts, than in cases of compounds such as titanium nitride, silicon nitride, and the like where undercuts are likely to be caused. Utilizing the resist pattern forming process of the present invention enables to prevent occurrence of undercuts even in the case of pattern formation on such a chromium compound film.

As explained above, adopting the negative resist composition of the present invention enables to form a pattern having a higher resolution while satisfying performances demanded for etching resistance, pattern profile, and the like, in photolithography for fine processing, and particularly in lithography adopting, as an exposure source, KrF laser, extreme ultraviolet rays, electron beam, X-rays, or the like.

DETAILED DESCRIPTION OF THE PREFERRED EMBODIMENTS

Although embodiments of the present invention will be explained hereinafter in detail, the present invention is not limited thereto.

As described above, the method to adopt a base polymer as a polymer for a chemically amplified negative resist, which base polymer mainly contains as repeating units a hydroxystyrene unit and a styrene unit substituted with an electron withdrawing group such that the polymer soluble in an alkaline developer is subjected to a cross-linking reaction upon reaction with an acid and the polymer is made to be poorly-soluble in the developer; has been utilized for a resist polymer for electron beam exposure, extreme ultraviolet rays exposure, or the like, even after the most-advanced lithography technique using ultraviolet rays has been shifted to ArF. Further, such a method has succeeded in forming a fine pattern having an excellent profile of 80 nm based on a resist film thickness of 240 nm by exposing the pattern to electro beam, as described in Japanese Patent Application Laid-open (kokai) No. 2008-249762, for example.

However, attempt to form a pattern having a minimum line width of 50 nm or less by adopting the chemically amplified resist composition which has attained the high-resolution as noted above, has resulted in occurrence of a problem of collapse of fine pattern lines in profile, or a problem of formation of bridges between pattern lines, thereby failing to achieve a higher resolution.

As such, the present inventors have established a working hypothesis that the reason to obstruct the higher resolution resides in a lack of mechanical strength of the resist film as noted above at the time of development thereof by an alkaline developer.

Based on the above hypothesis, the present inventors have envisaged an adoption of a polymer having a rigid structure as a base polymer, and have resultingly tried to use an acenaphthylene unit as a main monomer unit constituting a polymer instead of a styrene unit so as to obtain a more rigid base polymer. This rigid polymer is high in carbon density per unit, so that the polymer is enhanced in etching resistance, and the polymer advantageously allows for usage of a resultant resist film at a small thickness to thereby advantageously attain a pattern formation with higher resolution.

Incidentally, although the adoption of a monomer such as indene, acenaphthylene, or the like as noted above was convincing for an enhanced etching resistance because the monomer is capable of introducing cyclic structures into a main chain of the polymer by polymerization, it has been uncertain about quality control of a polymer to be obtained. Namely, as seen in examples of Japanese Patent Application Laid-open (kokai) No. 2008-249762, upon polymerization of an indene derivative and a hydroxystyrene derivative, those units derived from the indene derivative included in a polymer obtained by the polymerization are extremely less in amount relative to an added amount of indene derivative monomers used for the polymerization. Further, as seen in examples of Japanese Patent Application Laid-open (kokai) No. 2004-149756, considerable differences are seen in ratios between used monomer amounts and repeating unit amounts included in polymers obtained by polymerization, depending on kinds of substitutional groups, even in the case of polymerization by indene derivatives only. As such, when prevailing repeating units of a polymer such as 50 mole % or more of repeating units are to be provided by indene derivatives, it is very likely that quality differences, i.e., differences among ratios between repeating units included in obtained polymers, are brought about among polymers, such as those obtained at an initial stage of polymerization and those obtained at a later stage of polymerization. Further, Japanese Patent Application Laid-open (kokai) No. 2003-246825 has disclosed that variances of polymerization are seen even among (meth)acrylic acid derivatives and such variances bring about problems of resist performances, and it is thus strongly suggested that adoption of polymers entailing such variances into resist compositions for forming extremely fine patterns such as demanded presently, results in a risk of a problem occurrence of residues due to partial solubilities in pattern formation. Thus, designing in the case of adopting a compound, such as indene which is a polycyclic compound comprising an aromatic ring and a non-aromatic ring and in which a double bond to be involved in polymerization is included in the non-aromatic ring, has been mainly conducted in such a manner that: those repeating units, which play an important role in resolution-related functions, are provided by monomers such as hydroxystyrene derivatives capable of being stably polymerized, while units such as indene are to be introduced only in an amount required to enhance an etching resistance.

However, the present inventors have conducted various investigations in this opportunity, to find out that occurrence of bridges can be prevented by notably increasing an introduction amount of repeating units having acenaphthylene structures as units for increasing a rigidity of a polymer as compared to conventionally tried introduction amounts (about 25 mole % or less), to thereby cause the repeating units to act as a main constituent component, i.e., to attain its component ratio of 50 mole % or more.

In this respect, it is practically essential to combine repeating units having different functions with one another, so as to obtain a negative resist composition capable of providing a higher resolution. Nonetheless, the present inventors have found out that considerable discrepancies are not caused between a charged monomer amount and an amount of repeating units introduced into a polymer, in the case of an acenaphthylene derivative, by exemplarily and mixingly using two or more kinds of monomers having different substitutional groups in a manner to cause them to act as main constituent components, or by exemplarily conducting copolymerization of the acenaphthylene derivative with a monomer unit having an auxiliary function such as a monomer of styrene derivative. This fact means that it is possible to control a quality of a polymer in the case of exemplarily adopting an acenaphthylene derivative, insofar as by designing the polymer in a manner to assign a main function to such a polycyclic compound which comprises an aromatic ring and a non-aromatic ring and in which a double bond to be involved in polymerization is included in the non-aromatic ring upon copolymerization.

Then, the present inventors have copolymerized: a monomer mixture which contains two or more kinds of acenaphthylene derivatives as main constituent components; or a monomer mixture which contains one or more kinds of acenaphthylene derivatives as main constituent components and which contains a styrene derivative as a monomer having an auxiliary function; to thereby obtain a polymer for a negative resist, which polymer is used to prepare a negative resist composition; and the present inventors have resultingly found out that a resist film can be obtained therefrom, which has a higher resolution, and which never causes a problem of bridges even in the case of formation of a 50 nm line-and-space pattern, thereby carrying out the present invention.

Note that the above-mentioned working hypothesis is merely provided to explain the progression leading to the present invention, and never restricts the scope of right of the present invention.

Namely, the present invention provides a negative resist composition comprising at least:

(A) a base polymer which is soluble in alkali and which is insolubilized in alkali by an action of an acid; and/or a combination of a crosslinking agent and a base polymer which is soluble in alkali and which is reacted with the crosslinking agent by an action of an acid to thereby be insolubilized in alkali;

(B) an acid generator; and (C) a nitrogen-containing compound as a basic component;

wherein the polymer to be used as the base polymer is: a polymer, which is obtained by polymerizing two or more kinds of monomers represented by the following general formula (1), or which is obtained by polymerizing a monomer mixture containing one or more kinds of monomers represented by the general formula (1) and one or more kinds of styrene monomers represented by the following general formula (2); or a polymer obtained by subjecting the functional groups of the polymerizedly obtained polymer to a further chemical conversion; and wherein the repeating units derived from the monomers represented by the general formula (1) are included in the obtained polymer at a sum ratio of 50 mole % or more relative to a total amount of all repeating units constituting the obtained polymer:

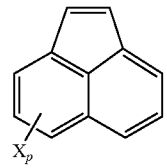

(1)

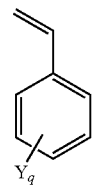

(2)

(in the formulae,

X represents (when present in plural, each independently represent): a hydroxyl group; a tri-hydrocarbon substituted silyloxy group having 3 to 18 carbon atoms; a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; a sulfinyl group; a sulfonyl group; or an alkyl group having 1 to 6 carbon atoms;

p is an integer of 0 to 4;

Y represents (when present in plural, each independently represent): a hydroxyl group; a trialkylsilyl group having 3 to 18 carbon atoms; a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; a sulfinyl group; a sulfonyl group; or an alkyl group having 1 to 6 carbon atoms;

q is an integer of 0 to 3; and at least one of X and Y is a hydroxyl group, or a substitutional group which is to be converted into a hydroxyl group by a chemical conversion).

In this way, the polymer to be used as the base polymer is: a polymer, which is obtained by polymerizing two or more kinds of monomers represented by the above general formula (1), or which is obtained by polymerizing a monomer mixture containing one or more kinds of monomers represented by the general formula (1) and one or more kinds of styrene monomers represented by the above general formula (2); or a polymer obtained by subjecting the functional groups of the polymerizedly obtained polymer to a further chemical conversion; and the repeating units derived from the monomers represented by the general formula (1) are included in the obtained polymer at a sum ratio of 50 mole % or more relative to a total amount of all repeating units constituting the obtained polymer. This enables to introduce the cyclic structures into main chains of the polymer molecules by polymerization, respectively, to make the polymer to have a rigid structure. Further, by using the thus obtained polymer as the base polymer to thereby prepare a negative resist composition, the negative resist composition is enabled to form a resist film which is enhanced in etching resistance and which has a higher resolution.

Further, the monomer having an acenaphthylene structure such as represented by the general formula (1) is capable of avoiding occurrence of considerable discrepancies between a charged amount of the adopted monomer and an amount of repeating units introduced into a polymer, thereby enabling to control a quality of the base polymer even when the above monomer is adopted as a main constituent component of the base polymer.

In the following, the base polymer which is soluble in alkali and which is insolubilized in alkali by an action of an acid, and/or the combination of a crosslinking agent and a base polymer which is soluble in alkali and which is reacted with the crosslinking agent by an action of an acid to thereby be insolubilized in alkali, will be explained first, as the component (A) to be used in the present invention.

The base polymer as the component (A) to be used in the present invention is a polymer, which is obtained by polymerizing two or more kinds of monomers represented by the following general formula (1), or which is obtained by polymerizing a monomer mixture containing one or more kinds of monomers represented by the general formula (1) and one or more kinds of styrene monomers represented by the following general formula (2); or a polymer obtained by subjecting the functional groups of the polymerizedly obtained polymer to a further chemical conversion; and the repeating units derived from the monomers represented by the general formula (1) are included in the obtained polymer at a sum ratio of 50 mole % or more relative to a total amount of all repeating units constituting the obtained polymer:

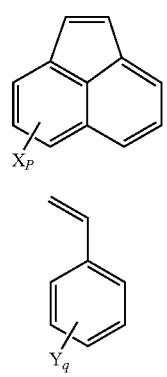

(in the formulae,

X represents (when present in plural, each independently represent): a hydroxyl group; a tri-hydrocarbon substituted silyloxy group having 3 to 18 carbon atoms; a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; a sulfinyl group; a sulfonyl group; or an alkyl group having 1 to 6 carbon atoms;

p is an integer of 0 to 4;

Y represents (when present in plural, each independently represent): a hydroxyl group; a trialkylsilyl group having 3 to 18 carbon atoms; a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; a sulfinyl group; a sulfonyl group; or an alkyl group having 1 to 6 carbon atoms;

q is an integer of 0 to 3; and at least one of X and Y is a hydroxyl group, or a substitutional group which is to be converted into a hydroxyl group by a chemical conversion).

Although base polymers for a negative resist are required to be soluble in an alkaline developer in themselves and thus each have an acidic functional group in themselves, phenolic hydroxyl groups are excellent as the acidic functional group so as to obtain a higher resolution. As such, among the functional groups X and Y in the general formulae (1) and (2), one of X when the monomer of the general formula (2) is not included in the base polymer; or one of X and Y, when the monomer of the general formula (2) is included in the base polymer; is a hydroxyl group; or is a functional group, such as a trialkyl-silyloxy group, an acyloxy group, an acetal group (which is one configuration of the above defined substitutable oxahydrocarbon group, where a hydrocarbon is ether bonded, through an oxygen atom, to a carbon atom bonded to an oxygen atom at the root of the substitutional group X or Y), or a tertiary alkyloxy group (which is one configuration of the above defined substitutable oxahydrocarbon group, where three carbon atoms are bonded to a carbon atom bonded to an oxygen atom at the root of the substitutional group X or Y), which functional group is to be converted into a phenolic hydroxyl group by a chemical conversion such as hydrolysis, after copolymerization.

Although an acenaphthylene derivative is usable for polymerization without protecting a hydroxyl group thereof, it is efficient in some cases to polymerize protected monomers thereof, followed by deprotection, in removing metal impurities, for example.

Although not explained in detail, such a method for protecting phenolic hydroxyl groups is well known, and deprotection can also be conducted by a known method. Further, in addition to the way to alkaline hydrolyze an acyloxy group into a hydroxyl group, it is possible to use an acyloxy group as a unit to be described later for restricting a solubility, by appropriately and selectively using an acid and an alkali for deprotection in an exemplary manner not to convert an acyloxy group into a hydroxyl group.

Examples of the hydrolyzable acyloxy group include linear, branched, or cyclic alkylcarbonyloxy groups having 2 to 18 carbon atoms, arylcarbonyloxy groups, and the like, which may each separately and additionally have a substitutional group such as a halogen, an alkoxy group, an acyl group, and the like. Only, it is unnecessary to adopt a particularly complicated compound as the base polymer upon usage thereof in a resist composition insofar as the functional group of the base polymer is hydrolyzable, so that easily available ones will do such as a base polymer having an acetyloxy group or the like. Further, the acyl group may be a sulfonyloxy group instead of a carbonyloxy group, and it is also possible to adpot a methylsulfonyloxy group, (4-methyl)phenylsulfonyloxy group, or the like as a general-purpose material.

In the case of adopting the tri-hydrocarbon substituted silyloxy group, examples thereof include a silyloxy group substituted with linear, branched; or cyclic alkyl group(s) having 3 to 18 carbon atoms, aryl group(s), or aralkyl group (s), and it is also unnecessary then to adopt a particularly complicated compound therefor.

Although protective groups which can be deprotected by an acid have been numerously used as acid labile groups for positive resist compositions, it is also possible here to use an acetal group or the like such as a tetrahydropyranyloxy group, 1-ethoxyethoxy group, and the like. Additionally, it is also possible to use, as a protective group, a tertiary alkylether obtained by adding a vinylalkyl to a hydroxyl group in an acidic atmosphere.

Further, it is preferable to adopt, as part of monomers of the monomer mixture and instead of monomers each having an acidic functional group, those among the monomers represented by the general formula (1) which are to be turned into repeating units each having a function to restrict a dissolution rate of the polymer, thereby causing a negative resist composition to possess a proper dissolution rate.

The general formulae (1) and (2) represent monomers which are to be turned into repeating units each having such a function to restrict a dissolution rate: when the monomers are such materials where p and q are 0 (zero), i.e., when all the substitutional groups are hydrogen atoms; when X and Y are not hydroxyl groups, and the monomers have no acidic groups such as carboxylic acid as substitutional groups, so that a chemical conversion of a polymer obtained by polymerization is not conducted; or when X and Y are not hydroxyl groups, and the monomers have no acidic groups such as carboxylic acid as substitutional groups, such that the monomers each have only such a combination of those groups, which groups are not influenced by a chemical conversion of the polymer even when the chemical conversion is conducted, or which groups are not turned into acidic groups even by the chemical conversion.

Even when X and Y are each a substitutable acyloxy group having 2 to 18 carbon atoms, these groups each act as a substitutional group having a function to restrict an alkaline dissolution rate of the polymer when alkaline hydrolysis is not conducted after polymerization as noted above. Further, when the carbon bonded to the carbonyl group is a tertiary carbon, hydrolysis can be avoided even when conducting an alkaline hydrolysis reaction under a weak condition.

When X and Y are each a substitutable oxahydrocarbon group having 1 to 18 carbon atoms, but not an acetal group nor a tertiary alkyloxy group, i.e., when they are each a primary or secondary alkyloxy group, aryloxy group, or aralkyloxy group, the repeating units act as substitutional groups each having a function to restrict an alkaline dissolution rate, naturally in a case where a chemical conversion is not conducted and also in a case where a typical chemical conversion is conducted.

Further, when X and Y are each a substitutable acyl group having 1 to 18 carbon atoms, i.e., a linear, branched, or cyclic substitutable alkylcarbonyl group, arylcarbonyl group, or aralkylcarbonyl group, or a sulfinyl group or a sulfonyl group, the repeating units act as substitutional groups each having a function to restrict an alkaline dissolution rate, naturally in a case where a chemical conversion is not conducted and also in a case where a typical chemical conversion is conducted. This is also true, when X and Y are each chlorine, bromine, iodine, a nitro group, a cyano group (cyano group is hydrolyzed, in the case of adopting a strong hydrolysis condition), or an alkyl group having 1 to 6 carbon atoms.

Note that, in the case of using, as a base polymer, a polymer obtained by copolymerizing those monomers substituted with electron withdrawing groups as X and Y, there is exhibited an effect to enhance a cross-linking density of the cross-linking reaction as an insolubilizing reaction in an exposed area of a resist film; and it is preferable that such electron withdrawing groups are included in monomers to be selected for copolymerization. Note that examples of the substitutional group having an effect to improve a cross-linking density, include an acyloxy group, an acyl group, a halogen, a nitro group, and a cyano group, and an acyl group, a halogen, a nitro group, and a cyano group are particularly remarkable in effect.

Further, in the case of adopting monomers each having a side-chain containing an epoxy group, such as a glycidyl group, as specific configurations of X and Y, the obtained polymer itself possesses an activity to form cross-linkages among polymer molecules irrespectively of presence or absence of a crosslinking agent. Similarly, the obtained polymer possesses a cross-linkage forming activity, also in the case of adopting monomers each having an acetal group in a side-chain and using them without hydrolysis. Only, in this case of acetal, such an activity is provided by a secondary cross-linking reaction by aldehydes produced by a reaction of the acetal with an acid.

Although the copolymerization of the monomers will be described later, the polymer obtained by copolymerization or the polymer additionally subjected to hydrolysis or chemical modification preferably contains repeating units represented by the following general formulae (3) and (4), respectively;

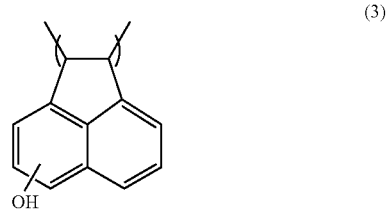

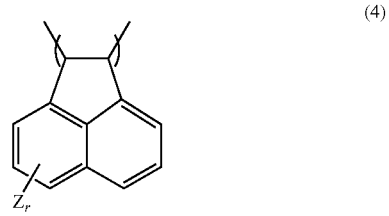

(in the formulae,

Z represents (when present in plural, each independently represent): a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; a sulfinyl group; a sulfonyl group; or an alkyl group having 1 to 6 carbon atoms; and r is an integer of 0 to 4); and the repeating units represented by the general formulae (3) and (4) are included in the obtained polymer at a sum ratio of 50 mole % or more relative to a total amount of all repeating units constituting the obtained polymer. By adopting, as a base polymer of a negative resist composition, the polymer where the repeating units represented by the general formulae (3) and (4) are included in the obtained polymer at a sum ratio of 50 mole % or more relative to a total amount of all repeating units constituting the obtained polymer, it is enabled to prepare a negative resist composition capable of forming a resist film having an enhanced etching resistance and a higher resolution.

When the repeating units derived from the monomers represented by the general formula (1), i.e., the repeating units having acenaphthylene structures, are included in the obtained polymer preferably at a ratio of 70 mole % or more, more preferably 80 mole % or more, and particularly preferably 95 mole % or more, from a standpoint of etching resistance, there can be exhibited an extremely high etching resistance. Further, according to the present invention, it is also possible to satisfactorily conduct a quality control of a polymer even when adopting such a polymer, thereby allowing for obtainment of an excellent resolution.

The polymer, where the repeating units represented by the general formulae (3) and (4) are included in the obtained polymer at a sum ratio of 50 mole % or more relative to a total amount of all repeating units constituting the obtained polymer, may further contain repeating units represented by the following general formula (10):

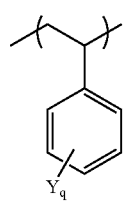

(10)

(in the formula,

Y represents (when present in plural, each independently represent): a hydroxyl group; a trialkylsilyl group having 3 to 18 carbon atoms; a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; a sulfinyl group; a sulfonyl group; or an alkyl group having 1 to 6 carbon atoms; and q is an integer of 0 to 3).

These repeating units can be easily and inexpensively obtained as various derivatives, so that they provide a range of choice for functional groups and are usable for a fine adjustment of a resist performance. Further, introducing these repeating units enables to adjust a rigidity of the polymer, and occasionally improves a resolution with an addition in a small amount depending on a combination of other repeating units.

Particularly, when those, among the repeating units represented by the general formula (10) which have electron withdrawing groups as Y as described above, are contained, there can be seen an effect to restrict occurrence of undercut near a substrate. While it is known that an undercut is caused due to a deteriorated cross-linking reactivity at a substrate-side boundary face of resist, the repeating unit (10) having electron withdrawing groups possess an effect to enhance a cross-linking reactivity. Its introduction amount is preferably 10 mole % or less relative to a total amount of all repeating units constituting the obtained polymer, because a rigidity and an etching resistance of the polymer are not deteriorated then.

Note that, into the polymer to be used as the base polymer of the negative resist composition of the present invention, it is possible to add other repeating units within a range that the function of the polymer is not deteriorated.

Examples of the units which can be added, exemplarily include those indene derivatives described in Japanese Patent Application Laid-open (kokai) Nos. 2004-149756 and 2006-169302, or the like. Only, in the case of indene derivatives, its ratio to be introduced as repeating units is preferably 30 mole % or less relative to a total amount of all repeating units, so as to control a quality of the polymerizedly obtained polymer as described above.

As a more specific combination of repeating units of the polymer included in the resist composition of the present invention, following examples are enumerated.

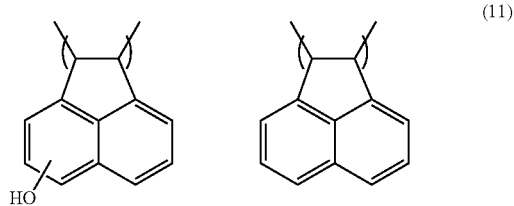

(11)

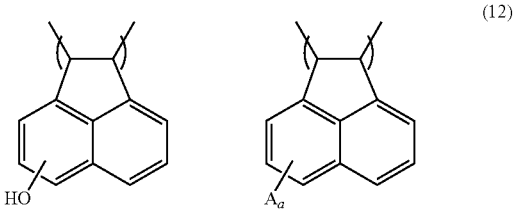

(12)

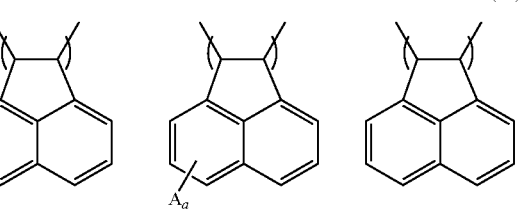

(13)

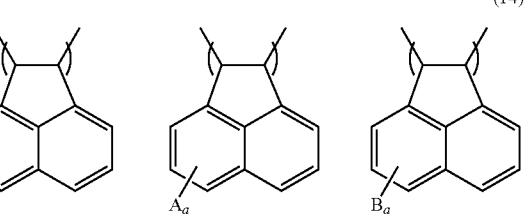

(14)

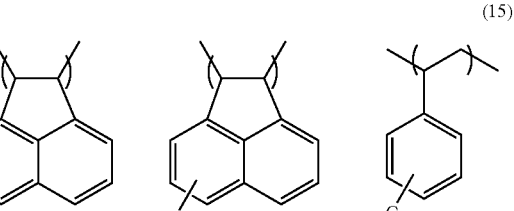

(15)

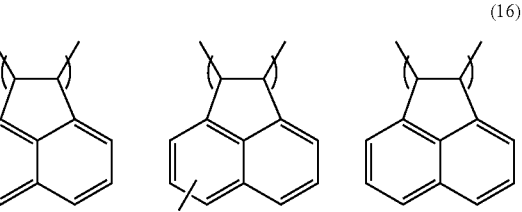

(16)

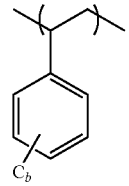

-continued

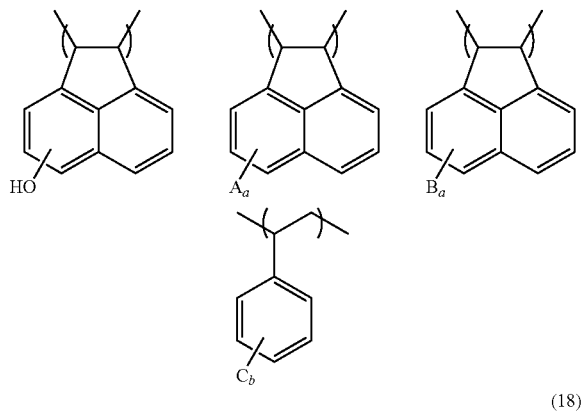

(17)

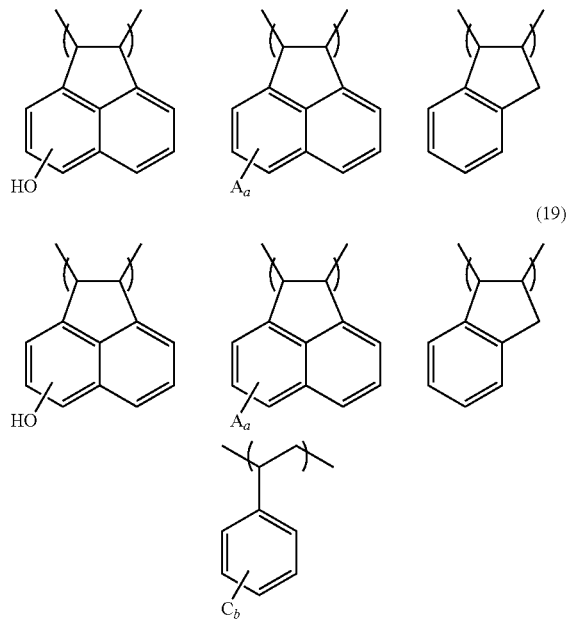

(18)

(19)

(In the formula, A, when present in plural, each independently represents: a substitutable acyloxy group having 2 to 18 carbon atoms, a substitutable acyl group having 2 to 18 carbon atoms, chlorine, bromine, iodine, a nitro group, a cyano group, a sulfinyl group, and a sulfonyl group; B, when present in plural, each independently represents: a substitutable oxahydrocarbon group having 1 to 18 carbon atoms, a substitutable hydrocarbon group having 1 to 18 carbon atoms; a is an integer of 1 to 4; C, when present in plural, each independently represents: a hydroxyl group, a substitutable acyloxy group having 2 to 18 carbon atoms, a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; a sulfinyl group; a sulfonyl group; and b is an integer of 0 to 3.)

The above noted polymer can be easily synthesized by exemplarily and radically polymerizing corresponding monomers in a known manner or the like (see Japanese Patent Application Laid-open (kokai) No. 2008-249762, for example). It is also possible to adopt such a manner to conduct the polymerization in a state that the phenolic hydroxyl groups are each protected by an acyl group as a protective group which can be alkaline hydrolyzed, or each protected by an acetal or tertiary alkyl group which can be acid hydrolyzed and to deprotect the phenolic hydroxyl groups.

Contrary, it is possible to once conduct polymerization by adopting monomers each having a phenolic hydroxyl group, and subsequently conduct a modifying reaction such as acylation so as to adjust a dissolution rate to establish a polymer to be finally used.

The base polymer to be used in the negative resist composition of the present invention is to preferably contain: repeating units (which correspond to hydroxyacenaphthylene units, and to styrene units substituted with hydroxyl groups, among the above-mentioned combination examples) having phenolic hydroxyl groups to thereby provide solubility in alkali; and repeating units for restricting a dissolution rate in an alkaline developer. It is further preferable that at least part of the repeating units for restricting the dissolution rate in the alkaline developer, includes the above-mentioned electron withdrawing groups. Since the content ratio between these repeating units strongly affects a resolution, pattern profile and the like of a resist, optimization of a copolymerization ratio is conducted after determining selection of the repeating units.

As a rough standard, the content ratio of repeating units upon copolymerization is such that the total amount of those repeating units which are possessed by the polymer having phenolic hydroxyl groups to thereby provide it with a solubility in alkali, is preferably 50 to 95 mole %, and more preferably 60 to 85 mole % relative to a total amount of all repeating units. Further, the repeating units substituted with above-mentioned electron withdrawing groups, respectively, are preferably more than 0 mole % and equal to or lower than 40 mole %, more preferably 5 to 35 mole % in amount.

When the total amount of the repeating units for providing a solubility in alkali is 95 mole % or less, the alkaline dissolution rate of an unexposed area is not excessively increased, and no problems are caused in pattern formation after development. Further, when the total amount is 50 mole % or more, there are never caused such problems of difficulty in formation of fine patterns, occurrence of underdevelopment, and the like. Moreover, when the ratio of the repeating units substituted with the above-mentioned electron withdrawing groups is more than 0 mole % and equal to or lower than 40 mole %, there can be obtained an effect by virtue of the introduction of the electron withdrawing groups.

The polymer as the component (A) to be included in the negative resist composition of the present invention is to preferably have a mass-average molecular weight of 1,000 to 50,000 (measurement is conducted by HLC-8120GPC by TOSOH CORPORATION; based on a gel permeation chromatography using polystyrene as the standard sample).

Mass-average molecular weights of 1,000 or more attain sufficient heat resistances of the negative resist compositions, and mass-average molecular weights of 50,000 or less avoid deterioration of resolutions of resist patterns and occurrence of defects of resist patterns after development.

Further, when the molecular weight distribution (Mw/Mn) of the polymer to be used in the negative resist composition of the present invention is narrow, there is a less possibility that extraneous substances are found on patterns, or that pattern shapes are deteriorated after exposure, due to presence of polymers having lower molecular weights and/or higher molecular weights. Since the influence of the molecular weight and the molecular weight distribution tends to be increased as pattern rules are made finer, it is preferable that the molecular weight distribution of the multicomponent copolymer to be used is between 1.0 and 2.5, and particularly between 1.0 and 1.8, and is thus low in dispersibility, so as to obtain a resist composition to be preferably used for fine pattern dimensions.

In the case of adding a crosslinking agent into the negative resist composition of the present invention, although it is certainly possible to integrate the crosslinking agent with the polymer compound in some cases as briefly noted above in such a way to add units having epoxy groups into the polymer, it is typical to separately add such a material as described below.

The crosslinking agent reacts with the base polymer by the aid of acid as a catalyst which has been produced from the acid generator as described later, in a manner to form crosslinkages within and among molecules of the base polymer, thereby making the base polymer insoluble in alkali. This agent is a compound having multiple functional groups which electrophilically react with aromatic rings or hydroxyl groups to be typically included in constitutional units of the base polymer to thereby form linkages, and numerous compounds have been already known therefor.

While any one of known crosslinking agents is basically utilizable as the crosslinking agent to be contained in the negative resist composition of the present invention, examples of preferable crosslinking agents include alkoxymethylglycolurils, and alkoxymethyl melamines, and specific examples of alkoxymethylglycolurils include tetramethoxymethylglycoluril, 1,3-bismethoxymethyl-4,5-bismethoxyethylene urea, bismethoxymethyl urea, and the like. Further, examples of alkoxymethyl melamines include hexamethoxymethyl melamine, hexaethoxymethyl melamine, and the like.

Examples of the addition amount of the crosslinking agent in the negative resist composition of the present invention include 2 to 40 parts by mass, preferably 5 to 20 parts by mass, relative to 100 parts by mass of solid contents in the negative resist composition. Further, the above noted crosslinking agents can be used solely in one kind, or mixedly in two or more kinds.

Basically usable as the acid generator as the component (B) to be contained in the negative resist composition of the present invention, are known acid generators usable in chemically amplified resists (such as those described in Japanese Patent Application Laid-open (kokai) No. 2008-249762, and the like).

Examples of preferable acid generators include photoacid generators of types of sulfonium salts, iodonium salts, sulfonyldiazomethanes, N-sulfonyloxyimides, and the like, which can be used solely in one kind, or mixedly in two or more kinds. Further, examples of a preferable counter anion(s) to be possessed by a sulfonic acid(s) produced from the salt(s) or compound(s), include a benzenesulfonic acid anion, toluenesulfonic acid anion, 4-(4-toluenesulfonyloxy)benzenesulfonic acid anion, pentafluorobenzenesulfonic acid anion, 2,2,2-trifluoroethanesulfonic acid anion, nonafluorobutanesulfonic acid anion, heptadecafluorooctane sulfonic acid anion, camphorsulfonic acid anion, and the like.

Among the acid generators, those acid generators based on triphenylsulfonium benzenesulfonate are preferable, because they are each capable of easily controlling a dissolution rate of a resist film in an alkaline developer to obtain fine and rectangular pattern lines in profile without defects.

Further, the benzenesulfonic acid portion, which is a counter anion of the acid generator based on the triphenylsulfonium benzenesulfonate, is appropriately adjusted between a purpose of diffusion control of the acid and a purpose of pattern profile control, by means of an alkyl group(s) to be introduced into its benzene nucleus. The diffusion is restrained in an order of methyl group<ethyl group<isopropyl group, and the sensitivity of resist is lowered simultaneously therewith. Basically, although the resolution tends to be improved by restricting diffusion of the acid, the reactivity is then rather lowered occasionally.

Moreover, although it has been known to be desirable to restrict diffusion of an acid generator so as to decrease undercuts, the reactivity is conversely deteriorated then, thereby defectively making it difficult to increase a cross-linking density. As such, it is preferable to mixingly use an acid generator having 2,4-dimethylbenzenesulfonic acid which is enhanced in diffusion, and an acid generator having 2,4,6-triisopropylbenzenesulfonic acid which is restricted in diffusion.

Since it has been known that a solubility of a resist film in an alkaline developer is lowered when an alkyl group is introduced into a benzene nucleus of the triphenylsulfonium cation portion, it is possible to control a solubility of a resist film in alkali by means of the acid generator. When the polymer is to be low in dissolution rate, an acid generator based on a triphenylsulfonium having an alkyl group introduced therein is effective.

Although the addition amount of the acid generator as the component (B) in the negative resist composition of the present invention is not particularly limited, such an addition amount is preferably 0.4 to 20 parts by mass, more preferably 0.8 to 15 parts by mass relative to 100 parts by mass of the base polymer as the component (A).

Here, it is possible to expect assurance of sensitivity and improvement of resolution, by simultaneously increasing the addition amount of the acid generator and the addition amount of the basic component (C) to be described later. Typically, addition amounts of 20 parts by mass or less of the acid generator as the component (B) allows for efficient obtainment of a sensitivity improving effect, thereby avoiding a possibility of uneconomical nature. Further, addition amounts of 0.4 part by mass or more eliminate a necessity to decrease the basic component down to a smaller amount so as to satisfy the demanded sensitivity, thereby avoiding a possibility that the resolution of a formed resist pattern is deteriorated.

Particularly, when the resist composition is used to form a resist film for irradiation of radiation or irradiation of electron beam thereto, addition of an acid generator is not problematic in energy attenuation of irradiated radiation within a resist film though higher sensitivity is scarcely obtained then, so that the addition amount of the acid generator is made to be a higher concentration such as preferably about 2.0 to 20 parts by mass, as compared to a situation of adoption of excimer laser light.

Similarly to the above-mentioned acid generator, basically usable as the basic component as the component (C) to be contained in the negative resist composition of the present invention, are known basic components usable in chemically amplified resists. Examples of the basic components include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives, such as enumerated in Japanese Patent Application Laid-open (kokai) No. 2008-249762.

The basic components as the component (C) may be used solely in one kind, or mixedly in two or more kinds, and the blending amount thereof is preferably 0.01 to 2 parts by mass, and particularly 0.01 to 1 part by mass mixed with 100 parts by mass of the base polymer. Blending amounts of 0.01 to 2 parts by mass exhibit blending effects, and avoid possibilities of excessively deteriorated sensitivities.

Among the basic components to be blended as the component (C), amine compounds or amine oxide compounds, each having a carboxyl group and each having no hydrogen atoms covalently bonded to a nitrogen atom as a basicity center, are particularly advantageous materials, because they are capable of avoiding such a situation that: in the case of adopting a different basic component while the base polymer as the component (A) is used in a negative resist composition, unreacted areas (so-called undercuts) are caused at pattern line ends near a substrate.

Examples of such substrates susceptible to occurrence of undercuts include nitrided material substrates such as TiN, SiN, SiON, and the like, and undercuts are considerably easily caused in case that the substrate particularly has a surface which is metal chromium or which is a chromium compound containing nitrogen and/or oxygen. Nonetheless, the above noted amine compounds and amine oxide compounds each exhibit a strong effect to avoid such a situation.

As specific examples of a chemical structure of the amine compound or the amine oxide compound, each having a carboxyl group and each having no hydrogen atoms covalently bonded to a nitrogen atom as a basic center as a basic component, compounds represented by the following formulae (5) to (7) are preferably enumerated, without any limitations.

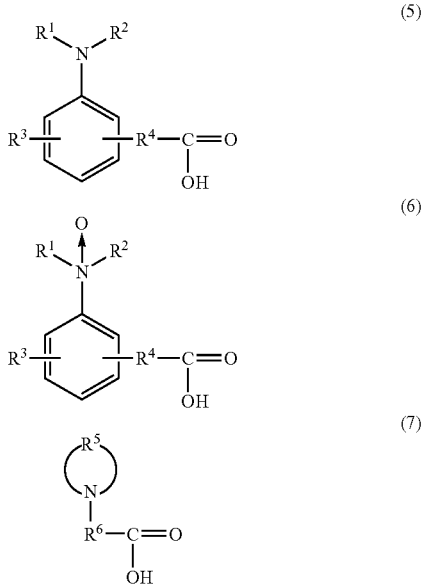

(In the formulae, $R^1$ and $R^2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthio-alkyl group having 1 to 10 carbon atoms;

$R^1$ and $R^2$ may be bonded to each other to form a ring structure;

$R^3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxy-alkyl group having 3 to 10 carbon atoms, an alkylthio-alkyl group having 1 to 10 carbon atoms, a halogen group, or a hydroxyl group, which may form a ring together with a carbon to which $R^3$ is bonded and together with another carbon adjacent to the carbon;

$R^4$ is a single bond, a linear, branched, or cyclic alkylene group having 1 to 20 carbon atoms, or an arylene group having 6 to 20 carbon atoms, which group may include one or several hydroxyl groups, carboxyl groups, carbonyl groups, and the like;

$R^5$ is a linear or branched substitutable alkylene group having 2 to 20 carbon atoms, wherein the alkylene group may include, between its carbon atoms, one or several carbonyl groups, ether groups, ester groups, and sulfides; and $R^6$ is a linear, branched, or cyclic alkylene group having 1 to 20 carbon atoms, or an arylene group having 6 to 20 carbon atoms.

In the general formulae (5) to (7), without any limitations, examples of an aryl group having 6 to 20 carbon atoms concretely include a phenyl group, naphthyl group, anthryl group, phenanthryl group, pyrenyl group, naphthacenyl group, and fluorenyl group; examples of a linear, branched, or cyclic alkyl group having 1 to 20 carbon atoms concretely include a methyl group, ethyl group, propyl group, isopropyl group, butyl group, isobutyl group, t-butyl group, pentyl group, hexyl group, decyl group, cyclopentyl group, cyclohexyl group, and decahydronaphthalenyl group; examples of an aralkyl group having 7 to 20 carbon atoms concretely include a benzyl group, phenethyl group, phenylpropyl group, naphthylmethyl group, naphthylethyl group, and anthracenylmethyl group; examples of a hydroxyalkyl group having 2 to 10 carbon atoms concretely include a hydroxymethyl group, hydroxyethyl group, and hydroxypropyl group; examples of an alkoxyalkyl group having 2 to 10 carbon atoms concretely include a methoxymethyl group, ethoxymethyl group, propoxymethyl group, isopropoxymethyl group, butoxymethyl group, isobutoxymethyl group, t-butoxymethyl group, t-amyloxymethyl group, cyclohexyloxymethyl group, cyclopentyloxymethyl group; examples of an acyloxyalkyl group having 3 to 10 carbon atoms concretely include a formyloxymethyl group, acetoxymethyl group, propionyloxymethyl group, butyryloxymethyl group, pivaloyloxymethyl group, cyclohexane carbonyloxymethyl group, and decanoyloxymethyl group; and examples of an alkylthio-alkyl group having 1 to 10 carbon atoms concretely include a methylthiomethyl group, ethylthiomethyl group, propylthiomethyl group, isopropylthiomethyl group, butylthiomethyl group, isobutylthiomethyl group, t-butylthiomethyl group, t-amylthiomethyl group, decylthiomethyl group, and cyclohexylthiomethyl group.

Without any limitations, preferable examples of the amine compounds represented by the general formula (5) include o-dimethylaminobenzoic acid, p-dimethylaminobenzoic acid, m-dimethylaminobenzoic acid, p-diethylaminobenzoic acid, p-dipropylaminobenzoic acid, p-diisopropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalene acid, 3-diethylamino-2-naphthalene acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllactic acid, 2-(4-dimethylaminophenyl)benzoic acid, and 2-(4-(dibutylamino)-2-hydroxybenzoyl)benzoic acid.

Without any limitations, preferable examples of the amine oxide compounds represented by the general formula (6) concretely include an oxide of the amine compounds represented by the general formula (5) as enumerated above.

Without any limitations, preferable examples of the amine compound represented by the general formula (7) concretely include 1-piperidinepropionic acid, 1-piperidinebutyric acid, 1-piperidinemalic acid, 1-piperidinepyruvic acid, 1-piperidinelactic acid, and the like.

A compound having amine oxide structure represented by the general formula (6) are to be produced by selecting optimum techniques corresponding to the structures of the compounds, respectively. Without any limitations, examples thereof include a technique to adopt an oxidation reaction using an oxidizing agent for a nitrogen-containing compound, and a technique to adopt an oxidation reaction of a nitrogen-containing compound in a diluted solution of hydrogen peroxide.

A synthesis scheme of the amine oxide compound represented by the general formula (6) is as shown below, for example.

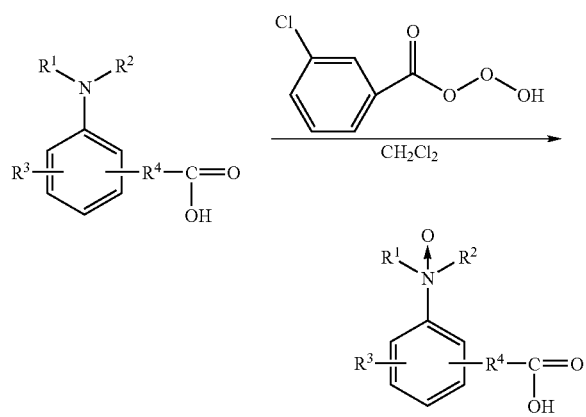

(In the formula, $R^1$, $R^2$, $R^3$, and $R^4$ are the same as the above.)

In the above formula, although this reaction is an oxidation reaction adopting an oxidizing agent (m-chloroperbenzoic acid) for amine, this reaction can be conducted by another oxidizing agent in a usual manner of an oxidation reaction. After the reaction, mixed reaction products can be purified by usual manners such as distillation, chromatography, recrystallization, and the like.

In the case of these amine compounds or amine oxide compounds, each having a carboxyl group within a molecule and each having no hydrogen atoms covalently bonded to a nitrogen atom as a basicity center, it is expected that presence of functional groups substituted to a nitrogen atom realizes rapid capture of generated acids while the carboxyl group is located at a substrate side, so that generated acids are prevented from diffusing into a substrate and from being inactivated; and as a result thereof, it is considered that a pattern profile exhibiting a higher resolution and providing pattern lines excellent in perpendicularity in profile at a substrate-side boundary face of resist, can be achieved.

As such, it is possible to prepare a negative resist composition capable of obtaining a more preferable pattern profile, by appropriately adjusting physical properties such as volatilities, basicities, acid capturing rates, and diffusion velocities in resist of the amine compounds or amine oxide compounds each having a carboxyl group and each having no hydrogen atoms covalently bonded to a nitrogen atom as a basicity center, correspondingly to combinations of the resist polymer (A) and the acid generator (B) to be used.

In this way, to obtain an effect to fully overcome a problem of undercut, it is more preferable to adopt a tertiary amine having no hydrogen atoms covalently bonded to a nitrogen atom as a basicity center, rather than amine compounds or amine oxide compounds such as a primary amine which has a hydrogen atom covalently bonded to a nitrogen atom as a basicity center even when the primary amine has a carboxyl group.

Further, it is possible to successfully arrange a carboxyl group at a substrate side to enable to prevent generated acids from diffusing into a substrate and from being inactivated, insofar as by a basic component having no hydrogen atoms covalently bonded to a nitrogen atom as a basicity center, other than those amine compounds or amine oxide compounds such as 2-quinolinecarboxylic acid, nicotinic acid and the like, each being a weak base and each having a nitrogen atom as a basicity center included in an aromatic ring.

Note that the effect of the basic component is obtainable irrespectively of a film thickness, and the basic component provides an advantageous effect also in the case of adopting a polymer protected by a tertiary alkyl group for forming a resist film having a thickness of 100 nm or more.

Further, the undercut profile restricting effect of the amine compound having a carboxyl group and having no hydrogen atoms covalently bonded to a nitrogen atom as a basicity center, is to be exhibited because the amine compound is located more concentratedly near a substrate by virtue of carboxyl groups as described above. Thus, it is not necessarily required that the component (C) fully comprises an amine compound having a carboxyl group and having no hydrogen atoms covalently bonded to a nitrogen atom as a basicity center so as to obtain the above effect, so that the amine compound can be used combinedly with such a basic component to be typically used, other than the above-mentioned amine compound having a carboxyl group and having no hydrogen atoms covalently bonded to a nitrogen atom as a basicity center.

In the case of using the amine compound having a carboxyl group and having no hydrogen atoms covalently bonded to a nitrogen atom as a basicity center, combinedly with a typically used amine other than the amine compound having a carboxyl group and having no hydrogen atoms covalently bonded to a nitrogen atom as a basicity center in the above manner; the blending ratio (mass ratio) between the above-described amine compound or amine oxide compound having a carboxyl group and having no active hydrogen atoms, and the other amine compound or amine oxide compound, is preferably within a range of 100:0 to 10:90.

Further, in the case of mixing the amine compound or amine oxide compound each having a carboxyl group and each having no active hydrogen atoms with the other amine compound or amine oxide compound, the amine compound or amine oxide compound represented by the following general formula (8) or (9) is preferably used as the other amine compound or amine oxide compound:

-continued

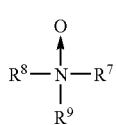
(9)

(in the formula, $R^7$, $R^8$, and $R^9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthio-alkyl group having 1 to 10 carbon atoms; and any two of $R^7$, $R^8$, and $R^9$ may be bonded to each other to form a ring structure or aromatic ring).

The negative resist composition of the present invention may be prepared by using organic solvents, and usable is any organic solvent in which the base polymer, the acid generator, other additives, and the like are soluble. Examples of the organic solvents include: ketones such as cyclohexanone and methyl-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone; which can be used solely, or mixedly in two or more kinds, without limited thereto. Desirably usable in the present invention among them, are ethyl lactate, propylene glycol monomethyl ether, propylene glycol monomethyl ether acetate, and mixed solvents of them, since they are most excellent in solubility for the acid generator in the resist components.

The usage amount of the organic solvent is preferably 1,000 to 10,000 parts, and particularly preferably 2,000 to 9,700 parts, relative to 100 parts of the base polymer. Adjusting to such a concentration allows for obtainment of a resist film having a film thickness of 10 to 100 nm stably and with an excellent flatness, by spin coating.

To improve a coatability of the negative resist composition of the present invention, it is possible to add thereto a conventional surfactant (D), as an optional component in addition to the above enumerated components. Note that the optional component may be added in an ordinary amount within a range, which does not obstruct the effect of the present invention.

Examples of surfactants include, without particular limitation, polyoxyethylene alkyl ethers such as polyoxyethylene lauryl ether, polyoxyethylene stearyl ether, polyoxyethylene cetyl ether, and polyoxyethylene olein ether;

polyoxyethylene alkyl aryl ethers such as polyoxyethylene octyl phenol ether, and polyoxyethylene nonyl phenol ether;

polyoxyethylene polyoxypropylene block copolymers;

sorbitan fatty acid esters such as sorbitan monolaurate, sorbitan monopalmitate, and sorbitan monostearate;

nonionic surfactants of polyoxyethylene sorbitan fatty acid ester, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate;

fluorinated surfactants such as F TOP EF301, EF303, EF352 (produced by JEMCO Inc.), MEGAFAC F171, F172, F173, R08, R30, R90, R94 (produced by Dai-Nippon Ink & Chemicals, Inc.), Fluorad FC-430, FC-431, FC-4430, FC-4432 (produced by Sumitomo 3M Co., Ltd.), ASAHI-GUARD AG710, SURFLON S-381, S-382, S-386, SC101, SC102, SC103, SC104, SC105, SC106, SURFINOL E1004, KH-10, KH-20, KH-30, KH-40 (produced by Asahi Glass Co.,);

organosiloxane polymers KP341, X-70-092, X-70-093 (produced by Shin-Etsu Chemical Co., Ltd.); and acrylic or methacrylic POLYFLOW No. 75, No. 95 (produced by Kyoeisha Yushi Kagaku Kogyo Co., Ltd.). Fluorinated oxetane ring-opening polymers type surfactants have an advantage whose addition amount change less affects resist coatability, so these surfactants are also preferably used. One example of these surfactants is PF-636 (produced by Omnova Solutions Inc.)

These surfactants can be used solely, or mixedly in two or more kinds.

Examples of the addition amount of the surfactant in the negative resist composition of the present invention include 2 parts by mass or less, preferably 1 part by mass or less, relative to 100 parts by mass of the base polymer (A) in the resist composition.

Further, the present invention provides a resist pattern forming process for forming a resist pattern by lithography, comprising at least the steps of:

forming a resist film on a processed substrate, by using the negative resist composition of the present invention;

exposing the resist film to a high energy beam; and developing the resist film by an alkaline developer, to obtain a resist pattern.

In turn, it is preferable to use a photomask blank as the processed substrate. Further, it is preferable that the photomask blank has an outermost surface layer formed with a chromium compound film thereon.

The formation of a resist film onto a processing substrate by using the negative resist composition of the present invention, is carried out through a step of coating the negative resist composition onto the processing substrate, and a subsequent prebaking step, and these steps can be conducted by known methods, respectively, to form resist films having thicknesses of 10 to 100 nm depending on purposes.

Although some methods are known as the coating step in addition to spin coating, the spin coating is desirable in order to obtain a uniform film thickness in the case of forming resist films having thicknesses of 10 to 100 nm.

When the processing substrate is a semiconductor wafer, coating conditions upon spin coating are required to be adjusted such as depending on the size of the wafer, a targeted film thickness, composition of the negative resist composition, and the like. In the case of obtaining a resist film thickness of about 100 nm by adopting an 8-inch wafer, the negative resist composition is to be cast onto the wafer, followed by rotation thereof at a revolution speed of 4,000 to 5,000 rpm for 40 seconds, thereby enabling obtainment of a resist film higher in uniformity. Here, the usage amount of a solvent to be used upon preparation of the resist composition is 1,400 to 1,600 parts relative to 100 parts of the base polymer.

Further, the resist film obtained in the above manner is subjected to prebaking, so as to remove an excessive solvent remaining in the film. The conditions of prebaking are typically 80 to 130° C. for 1 to 10 minutes, more desirably at 90 to 110° C. for 3 to 5 minutes, upon conduction on a hot plate.

When the processing substrate is a photomask blank, coating conditions are also required to be adjusted such as depending on the size of the blank, a targeted film thickness, composition of the resist composition, and the like. In the case of obtaining a resist film thickness of about 100 nm on a rectangular blank of 15.2 cm×15.2 cm, the resist composition is to be cast onto the blank, followed by rotation thereof at a revolution speed of 1,000 to 3,000 rpm for 2 seconds and a subsequent rotation at 800 rpm or less for 30 seconds, thereby enabling obtainment of a film higher in uniformity. Here, the usage amount of a solvent to be used upon preparation of the resist composition is 2,000 to 9,700 parts relative to 100 parts of the base polymer.

Further, the resist film obtained in the above manner is subjected to prebaking, so as to remove an excessive solvent remaining in the film. The conditions of prebaking are typically 80 to 130° C. for 4 to 20 minutes, more desirably at 90 to 110° C. for 8 to 12 minutes, upon conduction on a hot plate.

Next, pattern exposure is conducted for the above obtained resist film, for formation of an intended pattern. As an exposure method in the case of processing a semiconductor, there is held up a mask for forming the intended pattern above the resist film, followed by irradiation thereonto of high energy radiation such as deep ultraviolet rays, excimer laser, X-rays, or the like, or irradiation of electron beam, at an exposure dose of 1 to 100 µC/cm$^2$, preferably 10 to 100 µC/cm$^2$. In addition to the typical exposure method, it is also possible to adopt an immersion method for exposure in a manner to achieve liquid immersion between a projection lens and a resist as required.

Further, in the case of processing a photomask blank, this is not to produce many of the identical items, so that pattern exposure is typically conducted by beam exposure. Although the high energy radiation to be used is typically an electron beam, those high energy radiations are also usable, which include beams from the above-described and other light sources.

To conduct a chemical amplification reaction by diffusing acids typically after exposure, there is conducted post-exposure bake (PEB), as required, at 60 to 150° C. for 0.1 to 5 minutes, and preferably at 80 to 140° C. for 0.5 to 3 minutes, on a hot plate, for example.

There is then formed an intended pattern on the substrate by development in a usual manner such as a dipping, puddling, spraying method, or the like for 0.1 to 3 minutes, and preferably 0.5 to 2 minutes, by adopting 0.1 to 5 weight %, preferably 2 to 3 weight % of an aqueous alkaline developer such as tetramethylammonium hydroxide (TMAH). It is also possible to conduct a further heat treatment after development to thereby conduct a pattern size adjustment (i.e., thermal flow), as required. Note that the negative resist composition of the present invention is most suitable for fine patterning by deep ultraviolet rays or excimer laser at 250 to 120 nm, ultra-short ultraviolet rays, X-rays, or electron beams, among high energy radiations.

A substrate to be processed of lithography, to which the patterning process using the negative resist composition of the present invention is to be applied, may be any substrates insofar as subjected to utilization of lithography based on photoresists, such as a semiconductor wafer, an intermediate substrate of semiconductor production, a photomask substrate, and the like, and the effect of the present invention can be advantageously obtained in the case of a substrate having a film of metal compound thereon formed by a method such as sputtering.

Among the above, the effect of the present invention is particularly useful in a photomask blank having an outermost surface carrying thereon a chromium compound film formed as a light-shielding film or etching mask film, because it is difficult to control a profile of a resist pattern near its boundary face on a chromium compound of a chromium compound film. Examples of chromium compounds as materials at outermost surfaces of substrates to which the present invention is desirably applied, include metal chromium, chromium oxide, chromium nitride, chromium carbide, chromium oxide nitride, chromium oxide carbide, chromium nitride carbide, chromium oxide nitride carbide, and the like.

EXAMPLE

Although the present invention will be specifically explained by describing Synthesis Examples, Comparative Synthesis Examples, Examples, and Comparative Examples, the present invention is not limited to such Examples and Synthesis Examples.

Synthesis Example 1

Poured into a flask of 3 L were 316.9 g (1.51 moles) of 5-acetoxyacenaphthylene, and 96.1 g (0.51 mole) of 5-chloroacenaphthylene, as well as 675 g of toluene as a solvent. This reaction vessel was cooled down to −70° C. in an atmosphere of nitrogen, and repetitively subjected to degasification at a reduced pressure and to a nitrogen flow, three times. After temperature elevation up to a room temperature, 40.5 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was then concentrated to ½, and precipitated in 15.0 L of a methanol solution; and the obtained white solid was filtered, followed by drying at 40° C. under reduced pressure, to obtain 309 g of a white polymer.

This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. This reaction solution was concentrated, then dissolved into 870 g of ethyl acetate, thereafter once subjected to neutralizing liquid-separation washing by a mixed liquid of 250 g of water and 98 g of acetic acid, and further subjected to liquid-separation washing once by 225 g of water and 75 g of pyridine, and four times by 225 g of water. Thereafter, the ethyl acetate solution in the upper layer was concentrated, dissolved into 250 g of acetone, precipitated in 15 L of water, and filtered, followed by vacuum drying at 50° C. for 40 hours, to obtain 220 g of white polymer.

The obtained polymer was subjected to $^{13}$C, $^1$H-NMR, and GPC measurements, thereby obtaining the following analysis results:

Copolymerization composition ratio (mole ratio):
5-hydroxyacenaphthylene:5-chloroacenaphthylene=74.6:25.4
Weight-average molecular weight (Mw)=4,300
Molecular weight distribution (Mw/Mn)=1.48
This polymer was regarded as (Polymer-1).

Synthesis Example 2

Poured into a flask of 3 L were 320.1 g (1.52 moles) of 5-acetoxyacenaphthylene, 60.6 g (0.32 mole) of 5-chloroacenaphthylene, and 32.8 g (0.22 mole) of acenaphthylene, as well as 675 g of toluene as a solvent. Further, synthesis was conducted in the same manner as Synthesis Example 1.

The obtained polymer was subjected to $^{13}$C, $^1$H-NMR, and GPC measurements, thereby obtaining the following analysis results:

Copolymerization composition ratio (mole ratio):
5-hydroxyacenaphthylene:5-chloroacenaphthylene:acenaphthylene=74.0:15.8:10.2
Weight-average molecular weight (Mw)=4,400
Molecular weight distribution (Mw/Mn)=1.46
This polymer was regarded as (Polymer-2).

Synthesis Example 3

Synthesis was conducted in the same manner as Synthesis Example 2, while using 60.5 g (0.52 mole) of indene instead of 32.8 g (0.22 mole) of acenaphthylene.

The obtained polymer was subjected to $^{13}$C, $^1$H-NMR, and GPC measurements, thereby obtaining the following analysis results:

Copolymerization composition ratio (mole ratio):
5-hydroxyacenaphthylene:5-chloroacenaphthylene:indene=76.6:16.3:7.1
Weight-average molecular weight (Mw)=4,200
Molecular weight distribution (Mw/Mn)=1.52
This polymer was regarded as (Polymer-3).

Synthesis Example 4

Poured into a flask of 3 L were 319.4 g (1.52 moles) of 5-acetoxyacenaphthylene, 86.3 g (0.46 mole) of 5-chloroacenaphthylene, and 7.9 g (0.057 mole) of 4-chlorostyrene, as well as 675 g of toluene as a solvent. Further, synthesis was conducted in the same manner as Synthesis Example 1.

The obtained polymer was subjected to $^{13}$C, $^1$H-NMR, and GPC measurements, thereby obtaining the following analysis results:

Copolymerization composition ratio (mole ratio):
5-hydroxyacenaphthylene:5-chloroacenaphthylene:4-chlorostyrene=74.6:22.6:2.8
Weight-average molecular weight (Mw)=4,300
Molecular weight distribution (Mw/Mn)=1.48
This polymer was regarded as (Polymer-4).

Synthesis Example 5

Poured into a flask of 3 L were 325.4 g (1.55 moles) of 5-acetoxyacenaphthylene, 49.3 g (0.26 mole) of 5-chloroacenaphthylene, 7.7 g (0.055 mole) of 4-chlorostyrene, and 30.9 g (0.20 mole) of acenaphthylene, as well as 675 g of toluene as a solvent. Further, synthesis was conducted in the same manner as Synthesis Example 1.

The obtained polymer was subjected to $^{13}$C, $^1$H-NMR, and GPC measurements, thereby obtaining the following analysis results:

Copolymerization composition ratio (mole ratio):
5-hydroxyacenaphthylene:5-chloroacenaphthylene:4-chlorostyrene:acenaphthylene=74.8:12.7:2.7:9.8
Weight-average molecular weight (Mw)=4,200
Molecular weight distribution (Mw/Mn)=1.42
This polymer was regarded as (Polymer-5).

Synthesis Example 6

Poured into a flask of 3 L were 326.5 g (1.55 moles) of 5-acetoxyacenaphthylene, 40.8 g (0.22 mole) of 5-chloro-acenaphthylene, 15.9 g (0.11 mole) of 4-chlorostyrene, and 30.8 g (0.20 mole) of acenaphthylene, as well as 675 g of toluene as a solvent. Further, synthesis was conducted in the same manner as Synthesis Example 1.

The obtained polymer was subjected to $^{13}$C, $^1$H-NMR, and GPC measurements, thereby obtaining the following analysis results:

Copolymerization composition ratio (mole ratio):
5-hydroxyacenaphthylene:5-chloroacenaphthylene:4-chlorostyrene:acenaphthylene=74.6:10.3:5.5:9.6
Weight-average molecular weight (Mw)=4,200
Molecular weight distribution (Mw/Mn)=1.42
This polymer was regarded as (Polymer-6).

Synthesis Example 7

Synthesis was conducted in the same manner as Synthesis Example 5, while using 60.5 g (0.52 mole) of indene instead of 30.9 g (0.20 mole) of acenaphthylene.

The obtained polymer was subjected to $^{13}$C, $^1$H-NMR, and GPC measurements, thereby obtaining the following analysis results:

Copolymerization composition ratio (mole ratio):
5-hydroxyacenaphthylene:5-chloroacenaphthylene:4-chlorostyrene:indene=75.6:13.7:2.9:7.8
Weight-average molecular weight (Mw)=4,500
Molecular weight distribution (Mw/Mn)=1.48
This polymer was regarded as (Polymer-7).

Synthesis Example 8

Poured into a flask of 3 L were 100.0 g (0.48 mole) of 5-acetoxyacenaphthylene, 110.0 g (0.59 mole) of 5-chloroacenaphthylene, and 200.0 g (1.23 moles) of 4-acetoxystyrene, as well as 675 g of toluene as a solvent. Further, synthesis was conducted in the same manner as Synthesis Example 1.

The obtained polymer was subjected to $^{13}$C, $^1$H-NMR, and GPC measurements, thereby obtaining the following analysis results:

Copolymerization composition ratio (mole ratio):
5-hydroxyacenaphthylene:5-chloroacenaphthylene:4-hydroxystyrene=24.5:26.8:48.7
Weight-average molecular weight (Mw)=4,300
Molecular weight distribution (Mw/Mn)=1.42
This polymer was regarded as (Polymer-8).

Comparative Synthesis Example 1

Synthesis was conducted in the same manner as Synthesis Example 2, while using 251.1 g (1.55 moles) of 4-acetoxystyrene instead of 320.1 g (1.52 mole) of 5-acetoxyacenaphthylene.

The obtained polymer was subjected to $^{13}$C, $^1$H-NMR, and GPC measurements, thereby obtaining the following analysis results:

Copolymerization composition ratio (mole ratio):
4-hydroxystyrene:5-chloroacenaphthylene:acenaphthylene=73.5:16.0:10.5
Weight-average molecular weight (Mw)=4,200
Molecular weight distribution (Mw/Mn)=1.49
This polymer was regarded as (Comparative Polymer-1).

Comparative Synthesis Example 2

Poured into a flask of 3 L were 238.0 g (1.47 moles) of 4-acetoxystyrene, 29.8 g (0.16 mole) of 5-chloroacenaphthylene, and 189.4 g (1.63 moles) of indene, as well as 675 g of toluene as a solvent. Further, synthesis was conducted in the same manner as Synthesis Example 1.

The obtained polymer was subjected to $^{13}C$, $^1H$-NMR, and GPC measurements, thereby obtaining the following analysis results:

Copolymerization composition ratio (mole ratio):
4-hydroxystyrene:5-chloroacenaphthylene:indene=76.0: 6.5:17.5
Weight-average molecular weight (Mw)=4,200
Molecular weight distribution (Mw/Mn)=1.59
This polymer was regarded as (Comparative Polymer-2).

Comparative Synthesis Example 3

Poured into a flask of 3 L were 330 g (1.90 moles) of 6-acetoxyindene, and 200 g (1.32 moles) of 6-chloroindene, as well as 675 g of toluene as a solvent. This reaction vessel was cooled down to −70° C. in an atmosphere of nitrogen, and repetitively subjected to degasification at a reduced pressure and to a nitrogen flow, three times. After temperature elevation up to a room temperature, 40.5 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was then concentrated to ½, and precipitated in 15.0 L of a methanol solution; and the obtained white solid was filtered, followed by drying at 40° C. under reduced pressure, to obtain 260 g of a white polymer. This polymer was insufficient in yield (49%), as compared to the polymerization yield of 75% based on the acenaphthylene unit.

This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. This reaction solution was concentrated, then dissolved into 870 g of ethyl acetate, thereafter once subjected to neutralizing liquid-separation washing by a mixed liquid of 250 g of water and 98 g of acetic acid, and further subjected to liquid-separation washing once by 225 g of water and 75 g of pyridine, and four times by 225 g of water. Thereafter, the ethyl acetate solution in the upper layer was concentrated, dissolved into 250 g of acetone, precipitated in 15 L of water, and filtered, followed by vacuum drying at 50° C. for 40 hours, to obtain 182 g of white polymer.

Copolymerization composition ratio (mole ratio):
6-hydroxyindene:6-chloroindene=77.5:22.5
Weight-average molecular weight (Mw)=4,900
Molecular weight distribution (Mw/Mn)=1.68
This polymer was regarded as (Comparative Polymer-3).

From the Comparative Synthesis Examples 2 and 3, it is understood that the synthesis of the polymer based on the indene unit (main constituent component) is insufficient in yield, and exhibits a considerable discrepancy between the usage amount ratio of the monomers and the copolymerization composition ratio. Contrary, it is understood that the polymer such as in Synthesis Example 1 based on acenaphthylene exhibits substantially the same copolymerization composition ratio as the usage amount ratio, thereby facilitating the control of polymerization.

Example 1 to Example 8, and Comparative Example 1 to Comparative Example 3

Constituent materials of resist compositions, solvents, and the like used in Examples and Comparative Examples, are shown hereinafter.

Base polymers used in Examples are Polymer-1 to Polymer-8 obtained in Synthesis Examples 1 to 8, respectively. Base polymers used in Comparative Examples are Comparative Polymer-1 to Comparative Polymer-3 obtained in Comparative Synthesis Examples 1 to 3, respectively.

The acid generators used in Examples and Comparative Examples are triphenylsulfonium-2,5-dimethylbenzenesulfonate as PAG-1, triphenylsulfonium 2,4,6-triisopropylbenzenesulfonate as PAG-2, and t-butylphenyl(diphenyl)sulfonium 2,4,6-triisopropylbenzenesulfonate as PAG-3.

The organic solvents used in Examples and Comparative Examples are propylene glycol methyl ether (PGME) as solvent A, ethyl lactate (EL) as solvent B, and propylene glycol monomethyl ether acetate (PGMEA) as solvent C.

Further, the following compounds (Quenchers) are amine compounds having a carboxyl group and having no active hydrogen atoms and basic compounds having no carboxyl group, used in Examples and Comparative Examples, respectively.

Quencher-1: p-diethylaminobenzoic acid
Quencher-2: p-dibutylaminobenzoic acid
Quencher-3: oxide of p-dibutylaminobenzoic acid
Quencher-4: 1-piperidinepropionic acid
Quencher-5: tris(2-(methoxymethoxy)ethyl)amine
Quencher-6: oxide of tris(2-(methoxymethoxy)ethyl) amine
Quencher-7: N-2-(acetoxy)ethyl-imidazole The crosslinking agent is tetramethoxymethylglycoluril, surfactant A is PF-636 (produced by Omnova Solutions Inc.).

The base polymers, acid generators, basic components, organic solvents, surfactant, and crosslinking agent were prepared as listed in Table 1, to obtain negative resist compositions of Examples 1 to 8, and Comparative Examples 1 to 3.

TABLE 1

| Composition (parts by mass) | Ex. 1 | Ex. 2 | Ex. 3 | Ex. 4 | Ex. 5 | Ex. 6 | Ex. 7 | Ex. 8 | Com. Ex. 1 | Com. Ex. 2 | Com. Ex. 3 |
|---|---|---|---|---|---|---|---|---|---|---|---|
| Polymer-1 | 80 | | | | | | | | | | |
| Polymer-2 | | 80 | | | | | | | | | |
| Polymer-3 | | | 80 | | | | | | | | |
| Polymer-4 | | | | 80 | | | | | | | |
| Polymer-5 | | | | | 80 | | | | | | |
| Polymer-6 | | | | | | 80 | | | | | |
| Polymer-7 | | | | | | | 80 | | | | |
| Polymer-8 | | | | | | | | 80 | | | |
| Com. Polymer-1 | | | | | | | | | 80 | | |
| Com. Polymer-2 | | | | | | | | | | 80 | |
| Com. Polymer-3 | | | | | | | | | | | 80 |
| PAG-1 | 8 | 8 | 8 | 8 | 8 | 8 | 8 | 8 | 8 | 8 | 8 |
| PAG-2 | 2 | 2 | 2 | 2 | 2 | 2 | 2 | 2 | 2 | 2 | 2 |

TABLE 1-continued

| Composition (parts by mass) | Ex. 1 | Ex. 2 | Ex. 3 | Ex. 4 | Ex. 5 | Ex. 6 | Ex. 7 | Ex. 8 | Com. Ex. 1 | Com. Ex. 2 | Com. Ex. 3 |
|---|---|---|---|---|---|---|---|---|---|---|---|
| Crosslinking agent | 8.2 | 8.2 | 8.2 | 8.2 | 8.2 | 8.2 | 8.2 | 8.2 | 8.2 | 8.2 | 8.2 |
| Quencher-1 | 0.1 | 0.1 | 0.1 | 0.1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 | 0.07 | 0.07 | 0.07 | 0.07 |
| Solvent A | 800 | 800 | 800 | 800 | 800 | 800 | 800 | 800 | 800 | 800 | 800 |
| Solvent B | 800 | 800 | 800 | 800 | 800 | 800 | 800 | 800 | 800 | 800 | 800 |
| Solvent C | 1,000 | 1,000 | 1,000 | 1,000 | 1,000 | 1,000 | 1,000 | 1,000 | 1,000 | 1,000 | 1,000 |

The obtained negative resist compositions were each filtered by a filter of 0.04 μm size made of nylon resin, followed by spin coating of each resist solution at a revolution speed of 1,700 rpm onto a mask blank of 152 mm square having an outermost surface made of chromium oxide nitride, into a coated thickness of 90 nm.

Next, each mask blank was baked for 10 minutes on a hot plate at 110° C. Measurement of a thickness of each obtained resist film was conducted by an optical measurement device NanoSpec (manufactured by Nanometrics Incorporated). The measurement was conducted at 81 in-plane points of an applicable blank substrate except for an outer peripheral region from an outer edge to an inner extent at a distance of 10 mm therefrom, so as to calculate an averaged film thickness and a film thickness range.

Further, exposure was conducted with an electron beam exposure apparatus (EBM5000 Acceleration Voltage 50 keV manufactured by NuFLARE Technology, Inc.), followed by conduction of baking (PEB: post-exposure baking) at 120° C. for 10 minutes and subsequent development by aqueous solution of 2.38% tetramethylammonium hydroxide, thereby allowing for obtainment of negative patterns (Examples 1 to 8, and Comparative Examples 1 to 3).

The obtained resist patterns were evaluated as follows.

Assuming that an exposure dose for resolving top and bottom of a 200 nm line-and-space pattern at a resolution of 1:1 was an optimum exposure dose (sensitivity: Eop), a minimum line width of the line-and-space pattern found to be separated at this exposure dose was defined to be a resolution of the applicable evaluated resist. Further, the profile of each resolved resist pattern was observed at a cross-section of the resist by a scanning electron microscope, particularly in terms of presence or absence of undercuts at a substrate-side boundary face of resist.

Moreover, the dry etching resistance of each resist composition was indicated as a ratio of its decreased resist amount when the decreased amount of film thickness of Comparative Example 1 after etching was evaluated as 1.0, in a manner to actually conduct etching of each resist by an apparatus TE-8500S manufactured by Tokyo Electron Limited and to observe a pattern profile thereafter in a cross-section of the resist by a scanning electron microscope. Namely, smaller values imply resists which are more enhanced in etching resistance. Further, etching was conducted under the condition shown hereinafter: Press: 250 mJ, RF power: 800 W, Gas: 1) $CHF_3$ 20 sccm, 2) $CF_4$ 20 sccm, 3) Ar 400 sccm, etching time: 2 minutes and 30 seconds.

Shown in Table 2 are evaluation results of resolution, pattern cross-sectional profile, and etching resistance.

TABLE 2

| | Resolution (nm) | Cross-sectional profile | Relative etching resistance (Relative decreased amount of film thickness) |
|---|---|---|---|
| Ex. 1 | 50 | Good | 0.7 |
| Ex. 2 | 50 | Good | 0.7 |
| Ex. 3 | 50 | Good | 0.8 |
| Ex. 4 | 50 | Good | 0.8 |
| Ex. 5 | 50 | Good | 0.8 |
| Ex. 6 | 50 | Good | 0.8 |
| Ex. 7 | 50 | Good | 0.8 |
| Ex. 8 | 50 | Good | 0.85 |
| Com. Ex. 1 | 60 | Good | 1.0 |
| Com. Ex. 2 | 60 | Good | 1.0 |
| Com. Ex. 3 | 50 | Good | 0.8 |

From Table 2, it is firstly understood that Example 2, adopting hydroxyacenaphthylene instead of hydroxystyrene unit of Comparative Example 1, exhibited a smaller value of 0.7-fold for an etching resistance indicated as a decreased amount of film thickness after etching. Since the polymer of Example 1 also comprised acenaphthylene units only, this polymer similarly exhibited a smaller value of 0.7-fold of the etched amount of Comparative Example 1. Also in the case of adopting acenaphthylene units as main constituent components, etched amounts were restricted to lower values such as 0.8-fold (Example 3, Example 4, Example 5, Example 6, and Example 7), and 0.85-fold (Example 8) of the etched amount of Comparative Example 1. In turn, the etching resistance of Comparative Example 2, which adopted acenaphthylene units not as a main constituent component but in a supplemental manner similarly to Comparative Example 1 as in the conventional, was 1.0-fold identically to that of Comparative Example 1.

From this result, it is understood that those polymers including acenaphthylene units as main constituent components, i.e., those polymers each including acenaphthylene units in an amount of 50 mole % or more relative to a total amount of all repeating units, are enhanced in etching resistance.

Although Comparative Examples 1 and 2 of the polymers each configured to possess a solubility in alkali by means of 4-hydroxystyrene units, failed to resolve a pattern of 50 nm due to bridges, all the Polymer-1 to Polymer-8 (Example 1 to Example 8) based on acenaphthylene units were capable of resolving a pattern of 50 nm without any undercuts and bridges in profile.

Although Comparative Examples 1 and 2 were capable of preventing undercuts by virtue of the effect of the amines (Quenchers 1 and 3) each having a carboxyl group so that collapse of pattern lines of 50 nm was avoided, bridges were caused between pattern lines to fail to resolve a pattern of 50 nm. In turn, those base polymers including acenaphthylene structures as main constituent components are made rigid, so that swelling of pattern upon alkaline development is restricted Examples 1 to 8

Although Comparative Example 3 was capable of resolving pattern lines of 50 nm without undercuts and bridges in profile and exhibited an etching resistance of 0.8-fold of the etched amount of Comparative Example 1, this polymer was unsuitable for usage in a negative resist composition because polymers based on indene units were not allowed to be stably obtained as described in the paragraph discussing Comparative Synthesis Examples 2 and 3. This is also true for Comparative Example 2 as the polymer based on indene units.

Examples 9 to 14

As negative resist compositions of the present invention, the following ones were each prepared by blending an amine compound having a carboxyl group and having no hydrogen atoms covalently bonded to a nitrogen atom as a basicity center, with an amine compound containing no carboxyl groups as listed in the following Table 3, and negative patterns were formed in the same manner as Examples 1 to 8. The resolutions and pattern profiles thereof were evaluated. The results thereof are listed in Table 4.

TABLE 3

| Composition (parts by mass) | Ex. 9 | Ex. 10 | Ex. 11 | Ex. 12 | Ex. 13 | Ex. 14 |
|---|---|---|---|---|---|---|
| Polymer-7 | 80 | 80 | 80 | 80 | 80 | 80 |
| PAG-1 | 8 | 8 | 8 | 8 | 8 | 8 |
| PAG-2 | 2 | 2 | 2 | 2 | 2 | 2 |
| Crosslinking agent | 8.2 | 8.2 | 8.2 | 8.2 | 8.2 | 8.2 |
| Quencher-1 | | | | 0.1 | | |
| Quencher-2 | | | | | 0.1 | |
| Quencher-3 | | | | | | 0.1 |
| Quencher-4 | 0.1 | 0.1 | 0.1 | | | |
| Quencher-5 | 0.1 | | | 0.1 | 0.1 | 0.1 |
| Quencher-6 | | 0.1 | | | | |
| Quencher-7 | | | 0.1 | | | |
| Surfactant A | 0.07 | 0.07 | 0.07 | 0.07 | 0.07 | 0.07 |
| Solvent A | 800 | 800 | 800 | 800 | 800 | 800 |
| Solvent B | 800 | 800 | 800 | 800 | 800 | 800 |
| Solvent C | 1,000 | 1,000 | 1,000 | 1,000 | 1,000 | 1,000 |

TABLE 4

| | Resolution (nm) | Cross-sectional profile | 50 nm pattern collapse |
|---|---|---|---|
| Ex. 9 | 50 | Good | nonexistence |
| Ex. 10 | 50 | Good | nonexistence |
| Ex. 11 | 50 | Good | nonexistence |
| Ex. 12 | 50 | Good | nonexistence |
| Ex. 13 | 50 | Good | nonexistence |
| Ex. 14 | 50 | Good | nonexistence |

As listed in Table 4, it was possible to form pattern lines of 50 nm without any undercuts, in all Examples each having an appropriate combination of one of Quencher-1 to Quencher-4 as an amine compound having a carboxyl group and having no active hydrogen atoms, with one of Quencher-5 to Quencher-7 as an amine compound containing no carboxyl groups.

Examples 15 to 20

As negative resist compositions of the present invention, the following ones were each prepared by blending an amine compound having a carboxyl group and having no hydrogen atoms covalently bonded to a nitrogen atom as a basicity center, with an amine compound containing no carboxyl groups as listed in the following Table 5, and negative patterns were formed in the same manner as Examples 1 to 8. The resolutions and pattern profiles thereof were evaluated. The results thereof are listed in Table 6. Electron beam sensitivity is listed at the lowermost row of Table 5.

TABLE 5

| Composition (parts by mass) | Ex. 15 | Ex. 16 | Ex. 17 | Ex. 18 | Ex. 19 | Ex. 20 |
|---|---|---|---|---|---|---|
| Polymer-7 | 80 | 80 | 80 | 80 | 80 | 80 |
| PAG-1 | 8 | 8 | 8 | 8 | 8 | 8 |
| PAG-2 | 2 | 2 | 2 | 2 | 2 | 2 |
| Crosslinking agent | 8.2 | 8.2 | 8.2 | 8.2 | 8.2 | 8.2 |
| Quencher-1 | 0.1 | 0.1 | 0.1 | | | |
| Quencher-4 | | | | 0.1 | 0.2 | 0.3 |
| Quencher-5 | 0.2 | | | | | |
| Quencher-6 | | 0.2 | | | | |
| Quencher-7 | | | 0.2 | | | |
| Surfactant A | 0.07 | 0.07 | 0.07 | 0.07 | 0.07 | 0.07 |
| Solvent A | 800 | 800 | 800 | 800 | 800 | 800 |
| Solvent B | 800 | 800 | 800 | 800 | 800 | 800 |

TABLE 5-continued

| Composition (parts by mass) | Ex. 15 | Ex. 16 | Ex. 17 | Ex. 18 | Ex. 19 | Ex. 20 |
|---|---|---|---|---|---|---|
| Solvent C | 1,000 | 1,000 | 1,000 | 1,000 | 1,000 | 1,000 |
| Electron beam sensitivity ($\mu C/cm^2$) | 13 | 13 | 13 | 8 | 14 | 20 |

TABLE 6

| | Resolution (nm) | Cross-sectional profile | 50 nm pattern collapse |
|---|---|---|---|
| Ex. 15 | 50 | Good | nonexistence |
| Ex. 16 | 50 | Good | nonexistence |
| Ex. 17 | 50 | Good | nonexistence |
| Ex. 18 | 50 | Good | nonexistence |
| Ex. 19 | 50 | Good | nonexistence |
| Ex. 20 | 50 | Good | nonexistence |

As listed in Table 5 and Table 6, although increased amounts of amine compounds (Quencher) resulted in deteriorated sensitivities, resolutions were never deteriorated. In all Examples, patterns of 50 nm were allowed to be formed without undercuts. It was thus confirmed that a sensitivity required in a process can be adjusted by an amount of an amine compound in the above manner.

Examples 21 to 25, and Comparative Examples 4 to 5

As negative resist compositions of the present invention, the following ones were each prepared by adopting an amine compound containing no carboxyl groups as listed in the following Table 7, and negative patterns were formed in the same manner as Examples 1 to 8. The results of evaluation conducted for the resolutions and pattern profiles thereof are listed in Table 8.

TABLE 7

| Composition (parts by mass) | Ex. 21 | Ex. 22 | Ex. 23 | Ex. 24 | Ex. 25 | Com. Ex. 4 | Com. Ex. 5 |
|---|---|---|---|---|---|---|---|
| Polymer-1 | 80 | | | | | | |
| Polymer-2 | | 80 | | | | | |
| Polymer-3 | | | 80 | | | | |
| Polymer-5 | | | | 80 | | | |
| Polymer-8 | | | | | 80 | | |
| Com. Polymer-1 | | | | | | 80 | |
| Com. Polymer-2 | | | | | | | 80 |
| PAG-1 | 8 | 8 | 8 | 8 | 8 | 8 | 8 |
| PAG-2 | 2 | 2 | 2 | 2 | 2 | 2 | 2 |
| Crosslinking agent | 8.2 | 8.2 | 8.2 | 8.2 | 8.2 | 8.2 | 8.2 |
| Quencher-5 | 0.2 | 0.2 | 0.2 | 0.2 | 0.2 | 0.2 | 0.2 |
| Surfactant A | 0.07 | 0.07 | 0.07 | 0.07 | 0.07 | 0.07 | 0.07 |
| Solvent A | 800 | 800 | 800 | 800 | 800 | 800 | 800 |
| Solvent B | 800 | 800 | 800 | 800 | 800 | 800 | 800 |
| Solvent C | 1,000 | 1,000 | 1,000 | 1,000 | 1,000 | 1,000 | 1,000 |

TABLE 8

| | Resolution (nm) | Cross-sectional profile | 50 nm pattern collapse |
|---|---|---|---|
| Ex. 21 | 50 | Undercut | nonexistence |
| Ex. 22 | 50 | Undercut | nonexistence |
| Ex. 23 | 50 | Undercut | nonexistence |
| Ex. 24 | 50 | Good | nonexistence |
| Ex. 25 | 50 | Undercut | nonexistence |
| Com. Ex. 4 | 60 | Undercut | existence |
| Com. Ex. 5 | 60 | Undercut | existence |

As listed in Table 8, although slight undercuts were recognized in the case of Polymer-1 to Polymer-3 (Example 21 to Example 23) and Polymer-8 (Example 25) each including 50 mole % or more of acenaphthylene units and configured to possess a solubility in alkali, pattern lines of 50 nm were allowed to be resolved then without collapse in profile. Contrary, in the case of Comparative Polymer-1 (Comparative Example 4) and Comparative Polymer-2 (Comparative Example 5) supplementarily adopting acenaphthylene units in the conventional manner, bridges were caused between pattern lines, and patterns of 50 nm were not allowed to be resolved. Further, in the case of Comparative Polymer-1 (Comparative Example 4) and Comparative Polymer-2 (Comparative Example 5) configured to possess a solubility in alkali by means of 4-hydroxystyrene units, pattern lines were collapsed due to undercuts, and patterns of 50 nm were not allowed to be resolved.

In Example 21 to Example 23 and Example 25, it is considered that the base polymers were made rigid by adopting acenaphthylene structures in amounts of 50 mole % or more, i.e., as main constituent components, so that deformations of pattern lines were restricted upon alkaline development to thereby prevent collapse of pattern lines. Further, comparing pattern cross-sectional shapes thereof with those of Example 1 to Example 3 and Example 8, it is revealed that the amine compounds having carboxyl groups are effective for decreasing undercuts.

Moreover, in Polymer-5 (Example 24) accompanied by copolymerization of chlorostyrene units, undercuts were restricted. It is understood that slight copolymerization of chlorostyrene units allows for decrease of undercuts.

Examples 26 to 28

As negative resist compositions of the present invention, the following ones were each prepared by adopting PAG-3 instead of PAG-2 as an acid generator as listed in the following Table 9, and negative patterns were formed in the same manner as Examples 1 to 8. The results of evaluation conducted for the resolutions and pattern profiles thereof are listed in Table 10.

TABLE 9

| Composition (parts by mass) | Ex. 26 | Ex. 27 | Ex. 28 |
| --- | --- | --- | --- |
| Polymer-1 | 80 | | |
| Polymer-2 | | 80 | |
| Polymer-3 | | | 80 |
| PAG-1 | 8 | 8 | 8 |
| PAG-3 | 2 | 2 | 2 |
| Crosslinking agent | 8.2 | 8.2 | 8.2 |
| Quencher-5 | 0.1 | 0.1 | 0.1 |
| Surfactant A | 0.07 | 0.07 | 0.07 |
| Solvent A | 800 | 800 | 800 |
| Solvent B | 800 | 800 | 800 |
| Solvent C | 1,000 | 1,000 | 1,000 |

TABLE 10

| | Resolution (nm) | Cross-sectional profile | 50 nm pattern collapse |
| --- | --- | --- | --- |
| Ex. 26 | 50 | Good | nonexistence |
| Ex. 27 | 50 | Good | nonexistence |
| Ex. 28 | 50 | Good | nonexistence |

As listed in Table 10, it was possible to form a pattern of 50 nm without any undercuts in profile in all Examples. Even in the case of adopting the amine having no carboxyl groups, usage of PAG-3 allowed for obtainment of the pattern without undercuts in profile. PAG-3 exhibited a higher level of dissolution inhibiting effect, thereby enabling to restrict occurrence of undercuts.

As described above, it was recognized to be possible to remarkably improve a resolution while satisfying performances demanded for etching resistance, profile, and the like of a negative resist, by adopting, as a base polymer of a negative resist composition: a polymer, which is obtained by polymerizing two or more kinds of monomers represented by the above general formula (1), or which is obtained by polymerizing a monomer mixture containing one or more kinds of monomers represented by the general formula (1) and one or more kinds of styrene monomers represented by the above general formula (2); or a polymer obtained by subjecting the functional groups of the polymerizedly obtained polymer to a further chemical conversion; wherein the repeating units derived from the monomers represented by the general formula (1) are included in the obtained polymer at a sum ratio of 50 mole % or more relative to a total amount of all repeating units constituting the obtained polymer.

Particularly, since it has been proven that a resolution was remarkably improved while satisfying performances demanded for etching resistance, profile, and the like even in Examples (Examples 8 and 25) adopting Polymer-8 where the repeating units derived from the monomers represented by the general formula (1) were included in an amount of 51 mole %, it is proven that a great significance resides in the present invention configured to adopt the repeating units derived from the monomers represented by the general formula (1) as a main constituent component of the base polymer.

Namely, it has been confirmed that it is enabled to form a negative resist film having an excellent resolution and an enhanced etching resistance by adopting the negative resist composition of the present invention, and it is enabled to form a pattern with higher precision in a substrate surface by adopting the negative resist composition of the present invention.

The present invention is not limited to the above embodiments. The above embodiments are merely illustrative, and whatever having the substantially same configurations as the technical concept recited in the claims of the present application and exhibiting the same functions and effects are embraced within the technical scope of the present invention.

What is claimed is:
1. A negative resist composition comprising at least:
(A) a base polymer which is soluble in alkali and which is insolubilized in alkali by an action of an acid; and/or a combination of a crosslinking agent and a base polymer which is soluble in alkali and which is reacted with the crosslinking agent by an action of an acid to thereby be insolubilized in alkali;
(B) an acid generator; and
(C) a nitrogen-containing compound as a basic component;
wherein the polymer to be used as the base polymer is: a polymer, which is obtained by polymerizing two or more kinds of monomers represented by the following general formula (1), or which is obtained by polymerizing a monomer mixture containing one or more kinds of monomers represented by the general formula (1) and one or more kinds of styrene monomers represented by the following general formula (2); or a polymer obtained by subjecting the functional groups of the polymerizedly obtained polymer to a further chemical conversion;
wherein the repeating units derived from the monomers represented by the general formula (1) are included in the obtained polymer at a sum ratio of 50 mole % or more relative to a total amount of all repeating units constituting the obtained polymer;

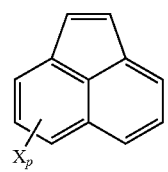
(1)

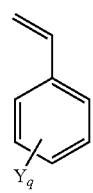
(2)

(in the formulae,
X represents (when present in plural, each independently represent): a hydroxyl group; a tri-hydrocarbon substituted silyloxy group having 3 to 18 carbon atoms; a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; or an alkyl group having 1 to 6 carbon atoms;

p is an integer of 0 to 4;

Y represents (when present in plural, each independently represent): a hydroxyl group; a trialkylsilyl group having 3 to 18 carbon atoms; a substitutable acyloxy group having 2 to 18 carbon atoms; a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; or an alkyl group having 1 to 6 carbon atoms;

q is an integer of 0 to 3; and at least one of X and Y is a hydroxyl group, or a substitutional group which is to be converted into a hydroxyl group by a chemical conversion);

wherein the polymer to be used as the base polymer contains repeating units represented by the following general formulae (3) and (4), respectively;

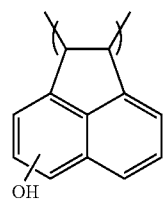

(3)

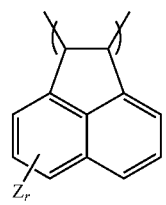

(4)

(in the formulae,

Z represents (when present in plural, each independently represent): a substitutable acyloxy group having 2 to 18 carbon atoms: a substitutable oxahydrocarbon group having 1 to 18 carbon atoms; a substitutable hydrocarbon group having 1 to 18 carbon atoms; a substitutable acyl group having 2 to 18 carbon atoms; chlorine; bromine; iodine; a nitro group; a cyano group; or an alkyl group having 1 to 6 carbon atoms; and r is an integer of 0 to 4); and wherein the repeating units represented by the general formulae (3) and (4) are included in the obtained polymer at a sum ratio of 50 mole % or more relative to a total amount of all repeating units constituting the obtained polymer.

2. The negative resist composition according to claim 1, wherein the further chemical conversion, to which the functional groups of the polymerizedly obtained polymer is subjected, is hydrolysis.

3. The negative resist composition according to claim 1, wherein the repeating units derived from the monomers represented by the general formula (1) are included in the obtained polymer at a ratio of 70 mole % or more relative to a total amount of all repeating units constituting the obtained polymer.

4. The negative resist composition according to claim 2, wherein the repeating units derived from the monomers represented by the general formula (1) are included in the obtained polymer at a ratio of 70 mole % or more relative to a total amount of all repeating units constituting the obtained polymer.

5. The negative resist composition according to claim 1, wherein the negative resist composition includes, as the basic component as the component (C), at least one or more kinds of amine compounds and amine oxide compounds, each having a carboxyl group and each having no hydrogen atoms covalently bonded to a nitrogen atom as a basicity center.

6. The negative resist composition according to claim 2, wherein the negative resist composition includes, as the basic component as the component (C), at least one or more kinds of amine compounds and amine oxide compounds, each having a carboxyl group and each having no hydrogen atoms covalently bonded to a nitrogen atom as a basicity center.

7. The negative resist composition according to claim 3, wherein the negative resist composition includes, as the basic component as the component (C), at least one or more kinds of amine compounds and amine oxide compounds, each having a carboxyl group and each having no hydrogen atoms covalently bonded to a nitrogen atom as a basicity center.

8. The negative resist composition according to claim 4, wherein the negative resist composition includes, as the basic component as the component (C), at least one or more kinds of amine compounds and amine oxide compounds, each having a carboxyl group and each having no hydrogen atoms covalently bonded to a nitrogen atom as a basicity center.

9. The negative resist composition according to claim 5, wherein the composition includes, as the amine compounds and amine oxide compounds, each having a carboxyl group and each having no hydrogen atoms covalently bonded to a nitrogen atom as a basicity center, at least one or more kinds of compounds represented by the following general formulae (5) to (7), respectively:

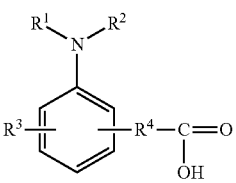

(5)

(in the formula, $R^1$ and $R^2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthio-alkyl group having 1 to 10 carbon atoms;

$R^1$ and $R^2$ may be bonded to each other to form a ring structure;

$R^3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, an alkylthio-alkyl group having 1 to 10 carbon atoms, a halogen group, or a hydroxyl group; and may form a ring together with a carbon to which $R^3$ is bonded and together with another carbon adjacent to the carbon; and $R^4$ is a single bond, or a linear, branched, or cyclic alkylene group having 1 to 20 carbon atoms, or an arylene group having 6 to 20 carbon atoms, which group may include one or several hydroxyl groups, carboxyl groups, carbonyl groups, and the like);

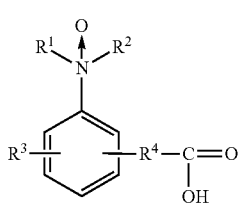

(6)

(in the formula, $R^1$, $R^2$, $R^3$, and $R^4$ are the same as the above); and

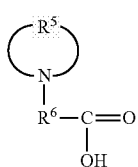

(7)

(in the formula, $R^5$ is a linear or branched substitutable alkylene group having 2 to 20 carbon atoms, wherein the alkylene group may include, between its carbon atoms, one or several carbonyl groups, ether groups, ester groups, and sulfides; and $R^6$ is a linear, branched, or cyclic alkylene group having 1 to 20 carbon atoms, or an arylene group having 6 to 20 carbon atoms).

10. The negative resist composition according to claim 8, wherein the composition includes, as the amine compounds and amine oxide compounds, each having a carboxyl group and each having no hydrogen atoms covalently bonded to a nitrogen atom as a basicity center, at least one or more kinds of compounds represented by the following general formulae (5) to (7), respectively:

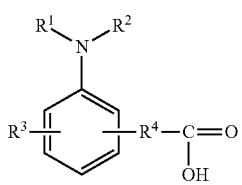

(5)

(in the formula, $R^1$ and $R^2$ are each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthio-alkyl group having 1 to 10 carbon atoms;

$R^1$ and $R^2$ may be bonded to each other to form a ring structure;

$R^3$ is a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, an alkylthio-alkyl group having 1 to 10 carbon atoms, a halogen group, or a hydroxyl group; and may form a ring together with a carbon to which $R^3$ is bonded and together with another carbon adjacent to the carbon; and $R^4$ is a single bond, or a linear, branched, or cyclic alkylene group having 1 to 20 carbon atoms, or an arylene group having 6 to 20 carbon atoms, which group may include one or several hydroxyl groups, carboxyl groups, carbonyl groups, and the like);

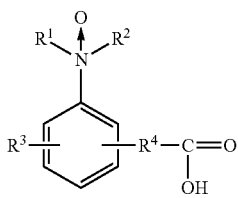

(6)

(in the formula, $R^1$, $R^2$, $R^3$, and $R^4$ are the same as the above); and

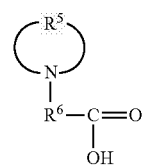

(7)

(in the formula, $R^5$ is a linear or branched substitutable alkylene group having 2 to 20 carbon atoms, wherein the alkylene group may include, between its carbon atoms, one or several carbonyl groups, ether groups, ester groups, and sulfides; and $R^6$ is a linear, branched, or cyclic alkylene group having 1 to 20 carbon atoms, or an arylene group having 6 to 20 carbon atoms).

11. The negative resist composition according to claim 5, wherein the basic component as the component (C) further contains at least one or more kinds of amine compounds and amine oxide compounds represented by the following general formulae (8) and (9), respectively:

(8)

(in the formula,

R$^7$, R$^8$, and R$^9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthio-alkyl group having 1 to 10 carbon atoms; and any two of R$^7$, R$^8$, and R$^9$ may be bonded to each other to form a ring structure or an aromatic ring); and

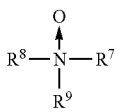 (9)

(in the formula, R$^7$, R$^8$, and R$^9$ are the same as the above).

12. The negative resist composition according to claim 10, wherein the basic component as the component (C) further contains at least one or more kinds of amine compounds and amine oxide compounds represented by the following general formulae (8) and (9), respectively:

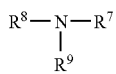 (8)

(in the formula,

R$^7$, R$^8$, and R$^9$ are each a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthio-alkyl group having 1 to 10 carbon atoms; and any two of R$^7$, R$^8$, and R$^9$ may be bonded to each other to form a ring structure or an aromatic ring); and

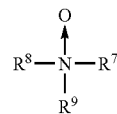 (9)

(in the formula, R$^7$, R$^8$, and R$^9$ are the same as the above).

13. A resist pattern forming process for forming a resist pattern by lithography, comprising at least the steps of:

forming a resist film on a processed substrate, by using the negative resist composition according to claim 1;

exposing the resist film to a high energy beam; and developing the resist film by an alkaline developer, to obtain a resist pattern.

14. A resist pattern forming process for forming a resist pattern by lithography, comprising at least the steps of:

forming a resist film on a processed substrate, by using the negative resist composition according to claim 12;

exposing the resist film to a high energy beam; and developing the resist film by an alkaline developer, to obtain a resist pattern.

15. The resist pattern forming process according to claim 13, wherein a photomask blank is used as the processed substrate.

16. The resist pattern forming process according to claim 14, wherein a photomask blank is used as the processed substrate.

17. The resist pattern forming process according to claim 15, wherein the photomask blank has an outermost surface layer having a chromium compound film deposited thereon.

18. The resist pattern forming process according to claim 16, wherein the photomask blank has an outermost surface layer having a chromium compound film deposited thereon.

\* \* \* \* \*